(12) United States Patent
Wright

(10) Patent No.: US 8,811,531 B2
(45) Date of Patent: Aug. 19, 2014

(54) QUADRATURE LATTICE MATCHING NETWORK

(75) Inventor: Peter V. Wright, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 501 days.

(21) Appl. No.: 13/070,424

(22) Filed: Mar. 23, 2011

(65) Prior Publication Data

US 2012/0243580 A1 Sep. 27, 2012

(51) Int. Cl.
*H04L 25/03* (2006.01)
*H03F 3/68* (2006.01)

(52) U.S. Cl.
USPC .............................. 375/297; 330/51; 330/295

(58) Field of Classification Search
CPC ......... H03F 1/0277; H03F 1/14; H03F 1/565; H03F 3/211; H03F 3/72; H03F 2203/21139; H03H 7/38
USPC ........ 375/297; 330/51, 124 R, 127, 199, 295; 455/127.1, 127.3
See application file for complete search history.

(56) References Cited

U.S. PATENT DOCUMENTS

| | | | |
|---|---|---|---|
| 1,604,981 A | 11/1926 | Elsasser | |
| 4,893,098 A | 1/1990 | Seely | |
| 4,951,009 A | 8/1990 | Collins | |
| 5,132,645 A | 7/1992 | Mayer | |
| 5,410,743 A | 4/1995 | Seely | |
| 6,262,690 B1 * | 7/2001 | Malone et al. | ................ 343/850 |
| 6,353,360 B1 | 3/2002 | Hau | |
| 6,496,061 B1 | 12/2002 | Bloom | |
| 6,515,541 B2 | 2/2003 | Cheng | |
| 6,806,768 B2 | 10/2004 | Klaren | |
| 6,954,623 B2 * | 10/2005 | Chang et al. | ................ 455/127.1 |
| 7,030,717 B2 | 4/2006 | Chung | |
| 7,071,792 B2 | 7/2006 | Meck | |
| 7,486,134 B2 | 2/2009 | Chang | |
| 7,486,136 B2 | 2/2009 | Bakalski | |
| 7,542,740 B1 | 6/2009 | Granger-Jones | |
| 7,570,932 B1 | 8/2009 | Folkmann | |
| 7,592,881 B2 | 9/2009 | Salomon | |
| 7,598,827 B2 | 10/2009 | Stuebing | |
| 2004/0235435 A1 * | 11/2004 | Barabash | ...................... 455/104 |
| 2005/0052259 A1 | 3/2005 | Okazaki | |
| 2006/0132232 A1 * | 6/2006 | Baree et al. | ..................... 330/51 |
| 2006/0290444 A1 | 12/2006 | Chen | |
| 2009/0195317 A1 | 8/2009 | Zhang | |

OTHER PUBLICATIONS

Hou, Jian-An, et al; "A Compact Quadrature Hybrid Based on High-Pass and Low-Pass Lumped Elements;" IEEE Microwave and Wireless Components Letters, vol. 17, No. 8, Aug. 2007.
Hou, Jian-An, et al; "Design and Analysis of Novel Quadrature Hybrids with Compact Lumped Elements;" Institute of Microelectronics & Department of Electrical Engineering, National Cheng-Kung University; Dec. 16-19, 2009.
U.S. Appl. No. 12/559,372; Non-Final Office Action dated Jul. 12, 2012.
U.S. Appl. No. 12/559,372; Final Office Action dated Jan. 28, 2013.
U.S. Appl. No. 12/559,372; Notice of Allowance dated Apr. 15, 2013.
U.S. Appl. No. 13/022,402; Non-Final Office Action dated Jun. 11, 2013.
U.S. Appl. No. 13/022,402; Final Office Action dated Nov. 27, 2013.

* cited by examiner

*Primary Examiner* — David B. Lugo
(74) *Attorney, Agent, or Firm* — Schwabe Williamson & Wyatt

(57) ABSTRACT

Embodiments include but are not limited to apparatuses and systems including a quadrature lattice matching network including first path having a series inductor and a shunt inductor, and a second path having a series capacitor and a shunt capacitor. Other embodiments may be described and claimed.

44 Claims, 48 Drawing Sheets

4600

Unbias a first power amplifier from a first path of a quadrature lattice matching network, and a second power amplifier from a second path of the quadrature lattice matching network
4602

Bias a low-power amplifier to an output node of the quadrature lattice matching network
4604

Control the low-power amplifier to provide an RF to the output node of the quadrature lattice matching network
4606

Output the RF signal as a single-ended output signal
4608

Figure 46

QUADRATURE LATTICE MATCHING NETWORK

TECHNICAL FIELD

Embodiments of the present invention relate generally to microelectronic devices and more particularly to quadrature lattice matching networks, and systems incorporating such quadrature lattice matching networks.

BACKGROUND

Amplification circuitry within mobile devices often has to account for varying transmit power requirements and varying impedance loading. These varying requirements may result in the amplification circuitry providing different transmit powers for different operational conditions of the mobile devices, e.g., the mode or frequency range in which the mobile device is operating, distance from the base station, etc. They also may require the amplification circuitry to exhibit minimal variation to external impedance changes. In order for the amplification circuitry to operate efficiently across a range of transmit powers, with a fixed supply voltage, the amplification circuitry may include a matching network that is capable of providing a varying impedance transformation.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 46 is a flow diagram of some of the operations associated with another method for operating an apparatus including a quadrature lattice matching network in accordance with various embodiments.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

This disclosure is generally drawn, inter alia, to lattice match. Embodiments include, but are not limited to, microelectronic devices and more particularly to quadrature lattice matching networks, and systems incorporating such quadrature lattice matching networks. Other embodiments may also be disclosed and claimed.

Figure 1:
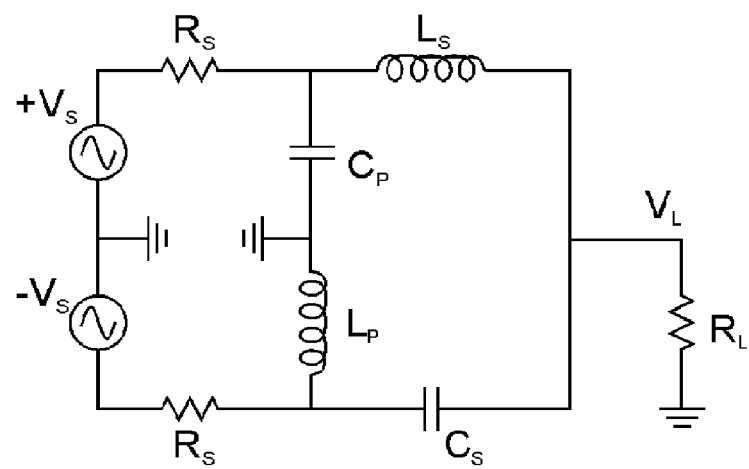
FIG. 1 is a circuit diagram of a related art matching circuit.

In the prior-art implementation of a lattice match network illustrated in FIG. 1, the phase shift in the upper path is −90° and the phase shift in the lower path is +90°. Thus, the differential phase shift between the two paths is 180°. With these phase shifts, the network always takes the form shown in FIG. 1.

Figure 2:
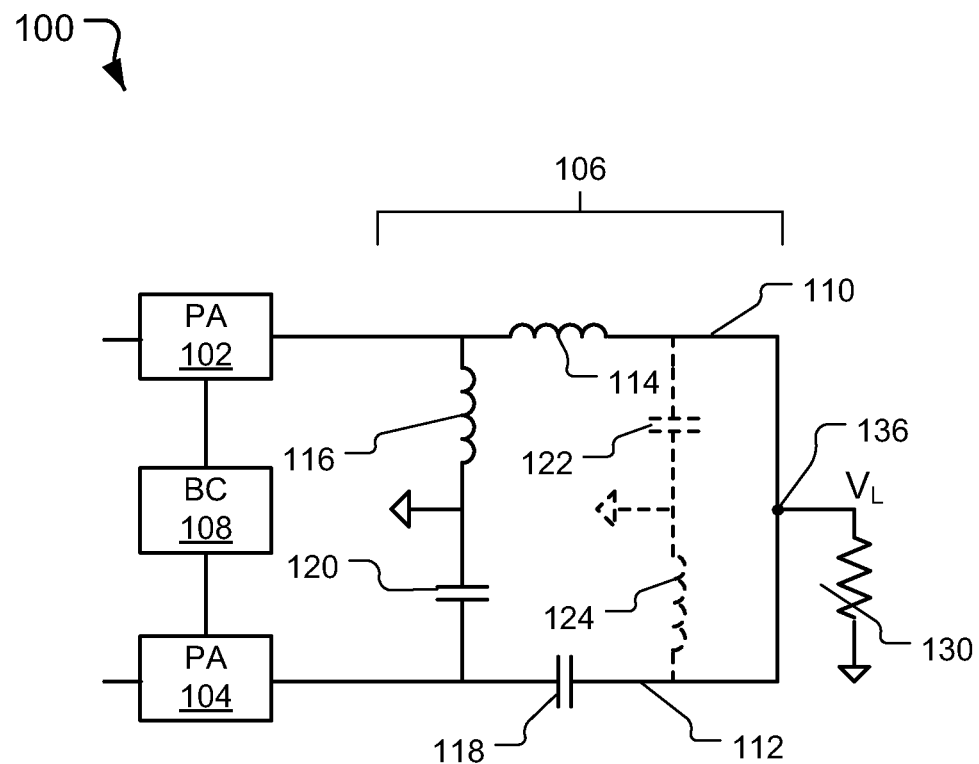
FIG. 2 is a circuit diagram of an apparatus including a quadrature lattice matching circuit in accordance with various embodiments.

Illustrated in FIG. 2 is an embodiment of an apparatus 100 including a first power amplifier (PA) 102 and a second power amplifier (PA) 104 in quadrature (i.e., with 90° phase delta) to form a quadrature lattice matching network 106 and selectively biased by a biasing circuit 108, in accordance with various embodiments of the present disclosure The quadrature lattice matching network 106 may be configured to provide quadrature phase combining and impedance matching in a three-port reactive network, including a first path 110 having a series inductor 114 and a shunt inductor 116, and a second path 112 having a series capacitor 118 and a shunt capacitor 120.

Figure 3:
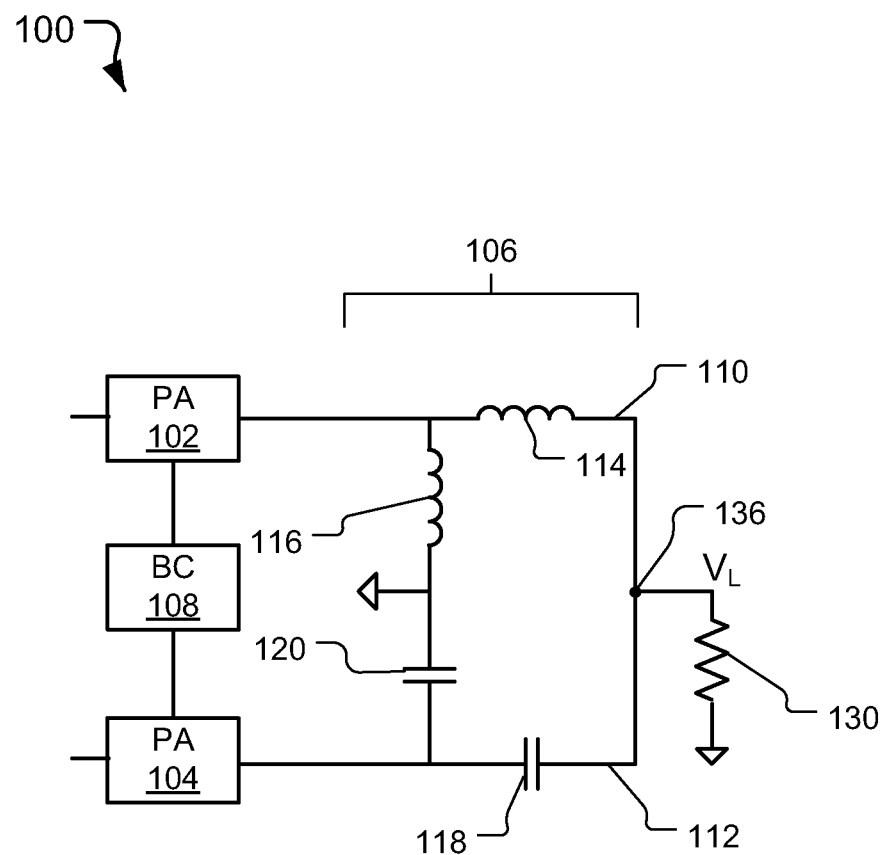
FIG. 3 is a circuit diagram of an apparatus including a quadrature lattice matching circuit in accordance with various embodiments.

Both paths 110, 112 of the network 106 are conceived as Π networks. If the upper path 110 and lower path 112 elements are complex conjugates of each other, then when they are put together, the shunt elements on the right, at the common node (e.g., shunt capacitor 122 and shunt inductor 124) are self-resonant and thus can be eliminated as illustrated in FIG. 3. Although the resulting network has only two elements, it is very important that there are conceptually three elements in each path, for it allows three independent parameters to be satisfied for the network. Any arbitrary input impedance (identical for upper path 110 and lower path 112), any output impedance at the common node, and any arbitrary phase shift through the paths (+Ø for upper path, −Ø for lower path) can be achieved.

If a phase shift Ø, other than 90°, is chosen, the form of the lattice network 106 can change, depending on the ratio $R_S/R_L$ and the phase shift Ø. For example, if Ø=45°, and $R_S<R_L$ (usually the case for PA matches of interest), then the network takes the form shown in FIG. 3.

Regardless of the differential phase shift of the networks, and the impedance values $R_S$ and $R_L$, the networks of FIG. 1 and FIG. 3 have the following in common:

1. Elements in upper and lower paths are complex conjugates of each other.
2. In each path, from left to right, there is one shunt element followed by one series element.
3. Arbitrary values for Ø, $R_S$, and $R_L$ can be realized.
4. At the common node on the right, the impedances presented by the two paths are complex conjugates of each other and are not pure real (a result of eliminating the mutually resonant elements).

Figure 4:
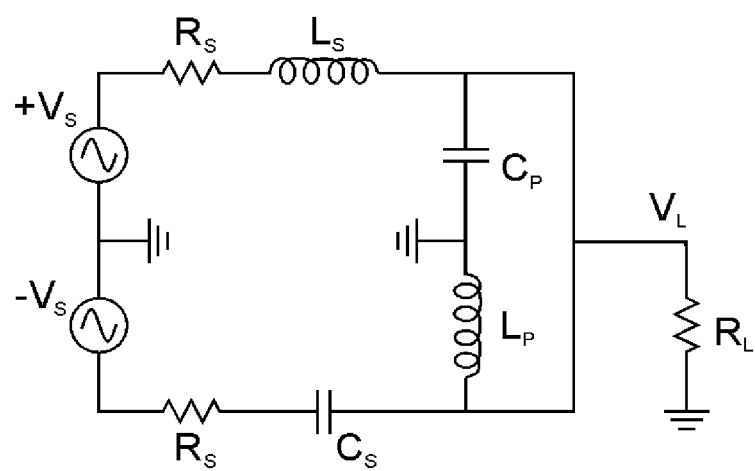
FIG. 4 is a circuit diagram of a related art matching circuit.

Compare the lattice match network 106 to the conventional approach, conceptually built from four elements, as shown in FIG. 4. In this case, since there are only two elements in each path, only two requirements can be satisfied. Typically, this is the desired input impedance value $R_S$, and phase shift Ø. The output impedance at the common node on the right is therefore not a design parameter and thus some form of additional matching must follow the combiner to achieve the desired output impedance RL. In practice, if the two paths are combined as shown in FIG. 3, the shunt elements can be eliminated as they are self-resonant as in the lattice. This is then a special limited case of the lattice, where the output impedance satisfies the relationship $R_S=R_L$. However, typically, additional matching is added to each path before combining the signals.

Referring again to the apparatus 100 of FIG. 3, the quadrature lattice matching network 106 may be configured to provide quadrature phase combining and impedance matching in a three-port reactive network, including a first path 110 having a series inductor 114 and a shunt inductor 116, and a second path 112 having a series capacitor 118 and a shunt capacitor 120. The outputs of the two parallel paths 110, 112 in the quadrature lattice matching network 106 are combined to a single-ended output at the output node 136 as illustrated. Overall, the quadrature lattice matching network 106 may provide a bandpass characteristic. In various embodiments, the quadrature lattice matching network 106 may be capable of realizing a load-insensitive, or substantially load-insensitive, radio-frequency (RF) power amplifier with high efficiency (low insertion loss), low cost, compact form factor, and reduced VSWR on output. For example, in various embodiments, an insertion loss reduction of 0.4 dB with inductor Q values of 30, and capacitor ESR ratings of 0.2 ohms compared with a conventional single-ended matching network.

In addition to greater control of the impedance of the quadrature lattice matching network 106, with increased bandwidth, the resulting apparatus 100 may be constructed with fewer elements, allowing the overall size and/or cost of the quadrature lattice matching network 106 to be reduced. For example, in some embodiments, the quadrature lattice matching network 106 may be implemented as an integrated passive device having a size ≤1 mm², and inherent low cost in cellband.

Figure 5A:
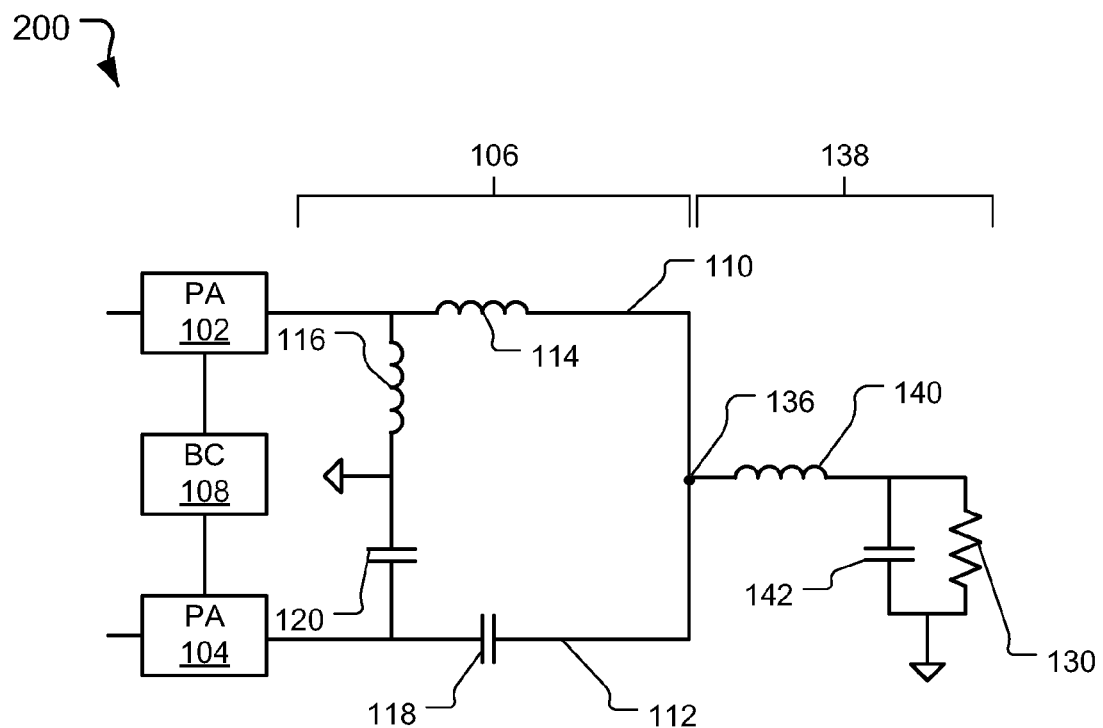
FIGS. 5A and 5B are circuit diagrams of apparatuses including a quadrature lattice matching circuit in accordance with various embodiments.
Figure 5B:
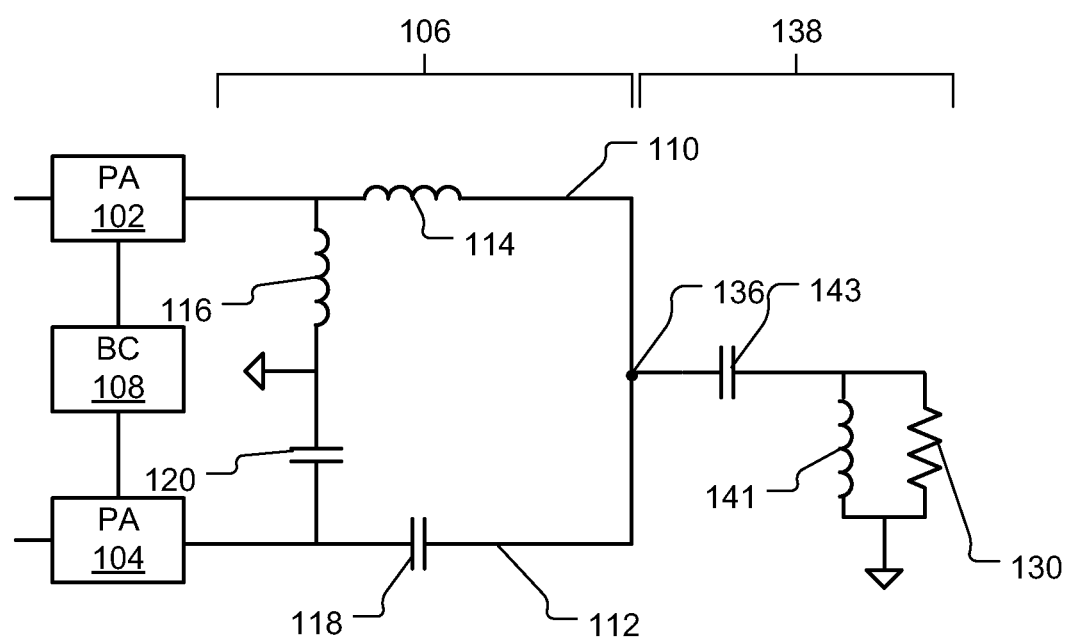

The load 130 may be directly coupled with an output node 136 of the quadrature lattice matching network 106. In various other embodiments, impedance transformation may be increased by including an output matching circuit coupled with the quadrature lattice matching network 106. As illustrated in FIG. 5A, an apparatus 200 having a low-pass characteristic may include an output matching circuit 138 having an output inductor 140 coupled with an output capacitor 142 and a load 130, with the output capacitor 142 and the load 130 coupled in parallel. FIG. 5B is a complementary high-pass characteristic apparatus, in which the quadrature lattice matching network 106 is followed by an output capacitor 143 coupled with an output inductor 141 and a load 130, with the output inductor 141 and the load 130 coupled in parallel.

One or both of the first power amplifier 102 and the second power amplifier 104 may include more than one power amplifier. In various embodiments, for example, the first power amplifier 102 may comprise a power amplifier chain including a first plurality of power amplifiers, and/or the second power amplifier 104 may comprise another power amplifier chain including a second plurality of power amplifiers.

Figure 6:
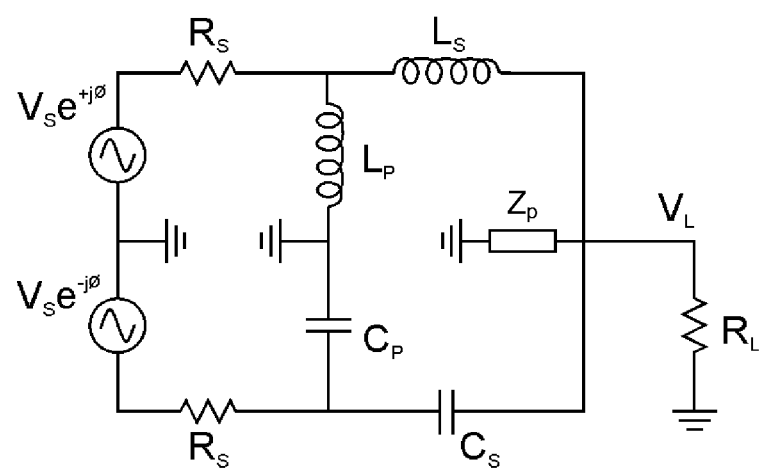
FIG. 6 is a circuit diagram of an apparatus including a quadrature lattice matching circuit in accordance with various embodiments.

Various embodiments of the quadrature lattice matching networks 106 may be capable of accommodating two different source impedances. If the source impedances are unequal, then the elements in the two paths 110, 112 are no longer complex conjugates of each other. This means that the two shunt elements 116, 120 at the common node do not fully resonate with each other and a small reactance ($Z_p$) may be added at the common node, as illustrated in FIG. 6, to account for this and ensure a real impedance at the common node. In the case that the network is followed by an additional LC match (such as match 138 illustrated in FIG. 5, the reactance shunt element ($Z_p$) may be absorbed into this additional match and thus eliminated.

The apparatuses 100, 200 may be configured for operating at high-power mode at or near a maximum output power ($p_{max}$) by selectively biasing the first power amplifier 102 and the second power amplifier 104 with the quadrature lattice matching network 106 by the biasing circuit 108. For operating in the high-power mode, for example, the first power amplifier 102 and the second power amplifier 104 may be biased by the biasing circuit 108.

In various embodiments, the quadrature lattice matching network 106 may have any one or more of a number of the following benefits. For example, the quadrature lattice matching network 106 may be capable of arbitrary differential phase and impedance transformation, and may allow for low insertion loss with independent harmonic termination, high harmonic attenuation, and flat matching characteristics achievable across a wide bandwidth. In various embodiments, one or more of these characteristics may permit the quadrature lattice matching network 106 to be used in a converged power amplifier device. The quadrature lattice matching network 106 may also significantly reduce gain and current variation with load mismatch, and improve output match. The quadrature lattice matching network 106 may also provide flexibility for improving backed-off efficiency by switching lattice input impedance without affected maximum power efficiency.

Figure 7:
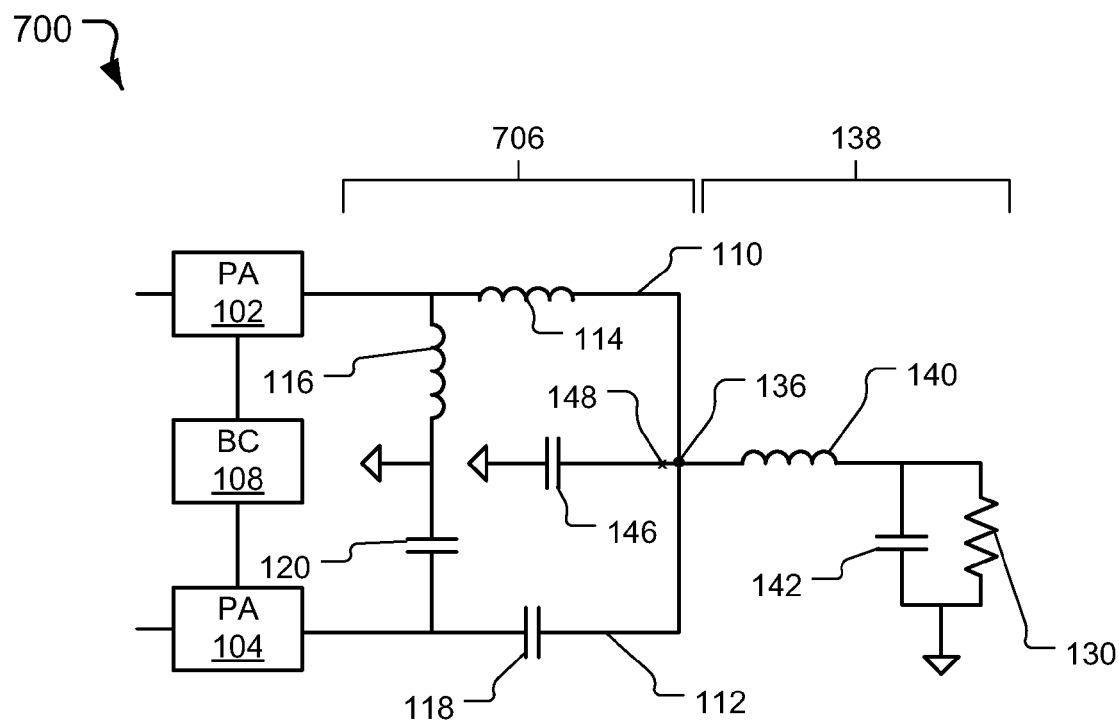
FIG. 7 is a circuit diagram of an apparatus including a quadrature lattice matching circuit in accordance with various embodiments.
Figure 8:
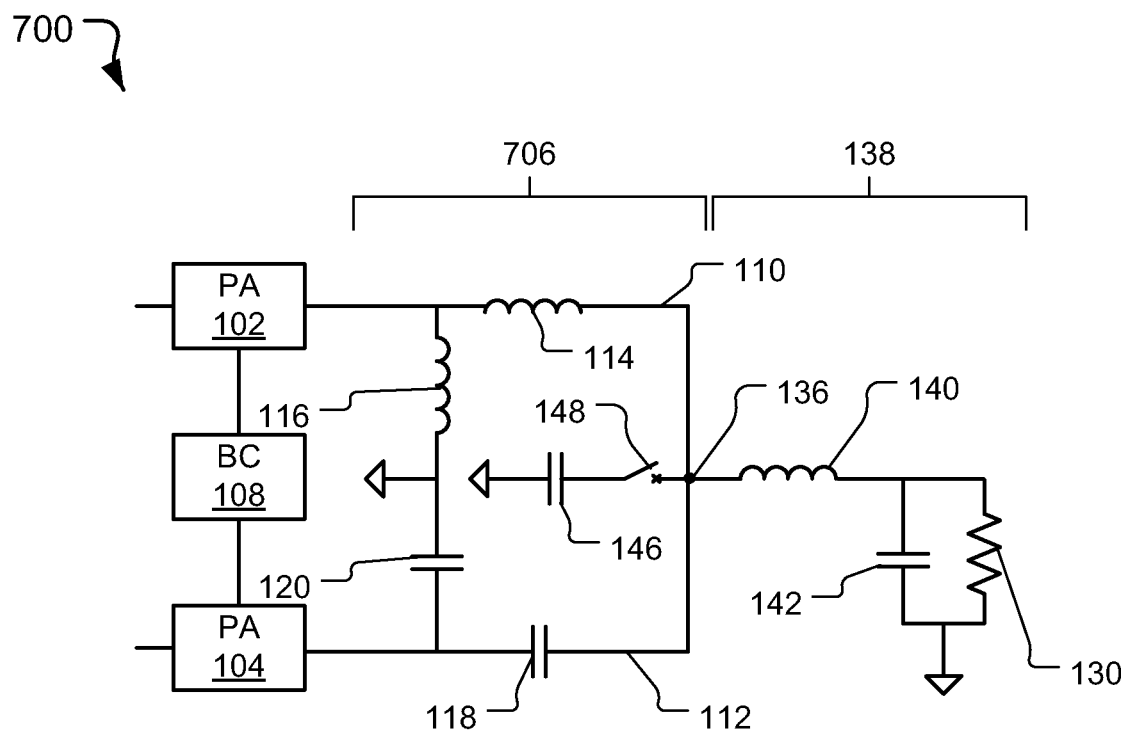
FIG. 8 is a circuit diagram of the apparatus of FIG. 7 operating in a high-power mode in accordance with various embodiments.
Figure 9:
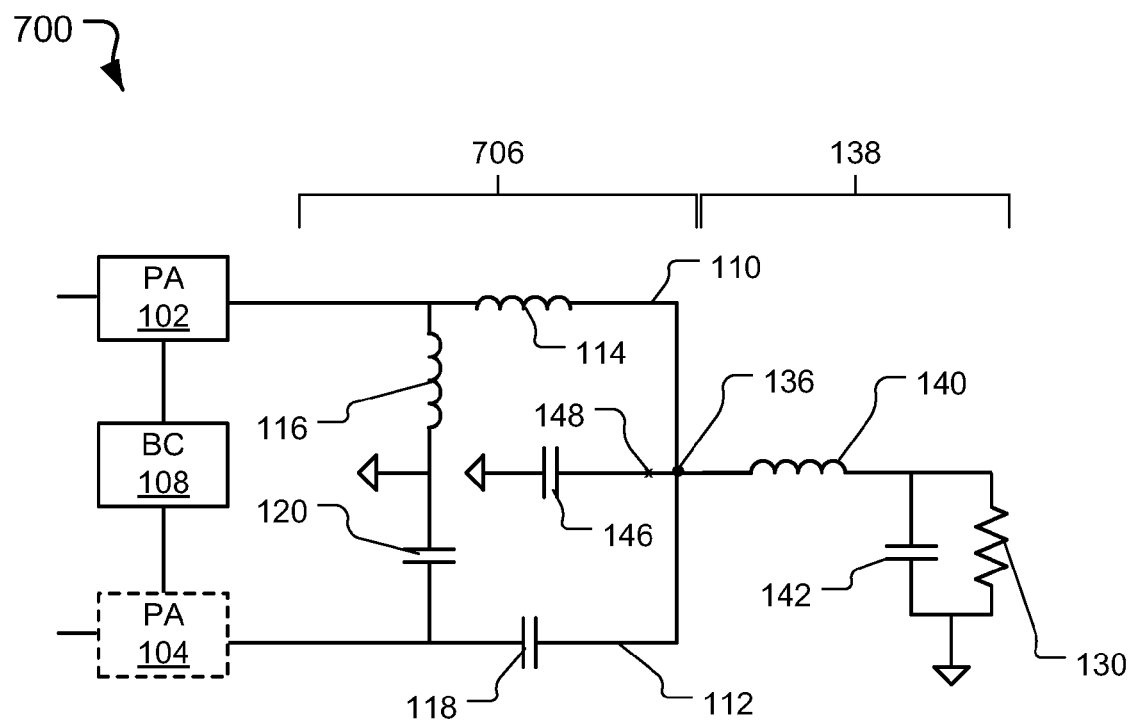
FIG. 9 is a circuit diagram of the apparatus of FIG. 7 operating in a medium-power mode in accordance with various embodiments.

An embodiment of an apparatus 300 configured for selectively operating in the high-power or at backed-off power modes is illustrated in FIGS. 7-9. As illustrated, the apparatus 700 includes many elements similar to those illustrated in FIGS. 3 and 5, including, for example, a first power amplifier 102, a second power amplifier 104, and a quadrature lattice matching network 706. The apparatus 700 further includes a capacitor 146 selectively coupled with the output node 136 of the quadrature lattice matching network 706, along with an output matching circuit 138 to which a load 130 is coupled. The capacitor 146 may be selectively coupled with the output node 136 by a switch 148.

For operating in the high-power mode and/or to accommodate differing impedances of the first power amplifier 102 and the second power amplifier 104, the biasing circuit 108 may bias the first power amplifier 102 and the second power amplifier 104, as illustrated in FIG. 8. Switching 148 to the open position may de-couple the capacitor 146 from the output node 136 of the quadrature lattice power matching network 706.

For operating at various power levels below $p_{max}$, the first power amplifier 102 may be biased, and the second power amplifier 104 may be unbiased, as illustrated in FIG. 9 (the second power amplifier 104 is illustrated with hashed lines to represent the unbiasing). In various embodiments, the switch 148 may be switched to the closed position, coupling the capacitor 146 to the output node 136 of the quadrature lattice power matching network 306. In other embodiments, the unbiased power amplifier 104 may provide sufficient shunt capacitance, in which case the switch 148 may be switched to the open position, de-coupling the capacitor 146 to the output node 136 of the quadrature lattice power matching network 706. For optimum performance, in low-power mode, the value of the capacitor 142 may be reduced. To reduce the capacitance of the capacitor 142, the capacitor 142 may comprise two parallel capacitors, one connected to the load 130 through a switch (not illustrated). For the low-power mode, this switch may be opened to reduce the capacitance across the load 130.

In various embodiments, the apparatus 700 may be operated at various power levels including power levels below $p_{max}$ by partially shorting the series inductor 114, and biasing the first power amplifier 102, and unbiasing the second power amplifier 104. In various embodiments, the switch 148 may be switched to the closed position, coupling the capacitor 146 to the output node 136 of the quadrature lattice power matching network 706. In other embodiments, the un-biased power amplifier 104 may provide sufficient shunt capacitance, in which case the switch 148 may be switched to the open position, de-coupling the capacitor 146 to the output node 136 of the quadrature lattice power matching network 706. In contrast to the low-power mode discussed above in which the capacitor 142 may be reduced and the capacitor 146 is switched into the circuit, in these embodiments, the capacitor 142 may remain fixed and instead the inductor 114 may be configured with a reduced inductance.

FIGS. 10-30 illustrate various embodiments of apparatuses including quadrature lattice matching networks configured to operate at various power levels including at or near $p_{max}$ and/or below $p_{max}$.

As discussed below, at least some of the embodiments include one or two switches. In various embodiments, the number of switches used may be limited to two, neither of which may be required to hold off the maximum voltage. The switches, therefore, can be small and may be associated with less insertion loss.

Figure 10:
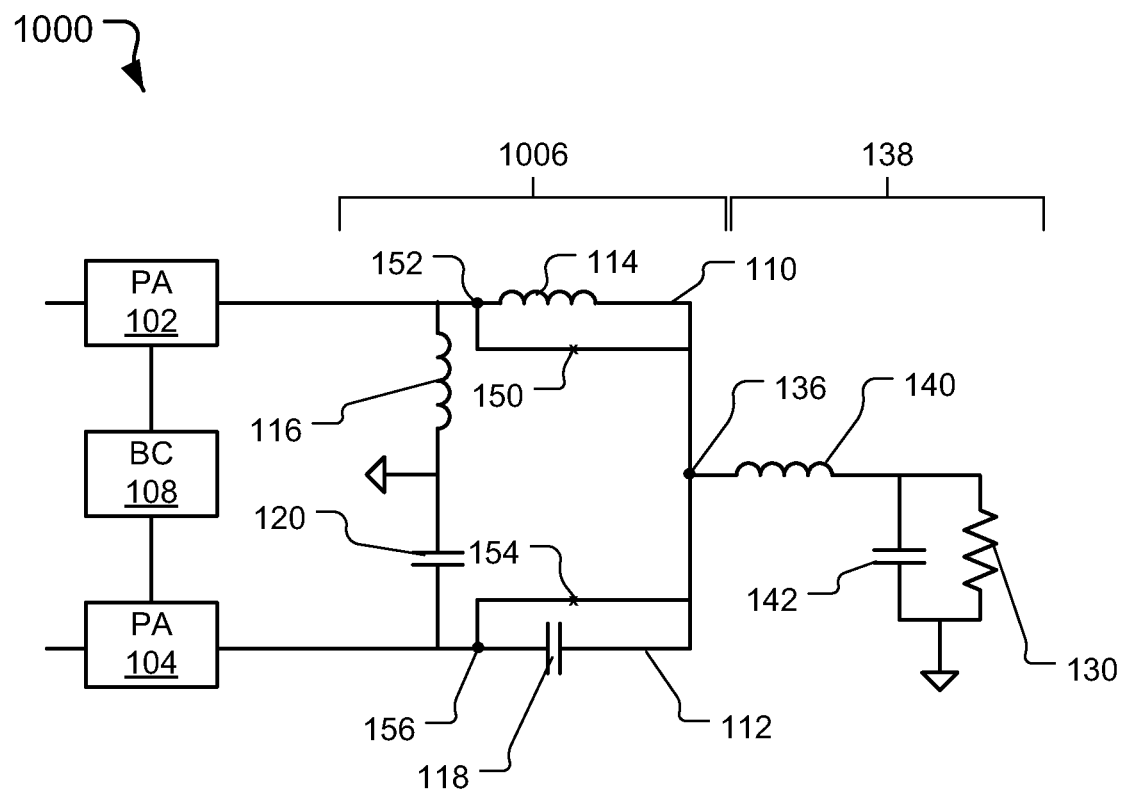
FIG. 10 is a circuit diagram of an apparatus including a quadrature lattice matching circuit in accordance with various embodiments.

As illustrated in FIG. 10, an apparatus 1000 may include many elements similar to those illustrated in previous Figures, including, for example, a first power amplifier 102, a second power amplifier 104, and a quadrature lattice matching network 1006 including a first path 110 having a series inductor 114 and a shunt inductor 116, and a second path 112 having a series capacitor 118 and a shunt capacitor 120. The apparatus 1000 may also include an output matching circuit 138 to which a load 130 is coupled.

The apparatus 1000 may further include a switch 150 configured to selectively couple a node 152, between the series inductor 114 and the shunt inductor 116, with the output node 136. The apparatus 1000 may further include a switch 154 configured to selectively couple a node 156, between the series capacitor 118 and the shunt capacitor 120, with the output node 136.

Figure 11:
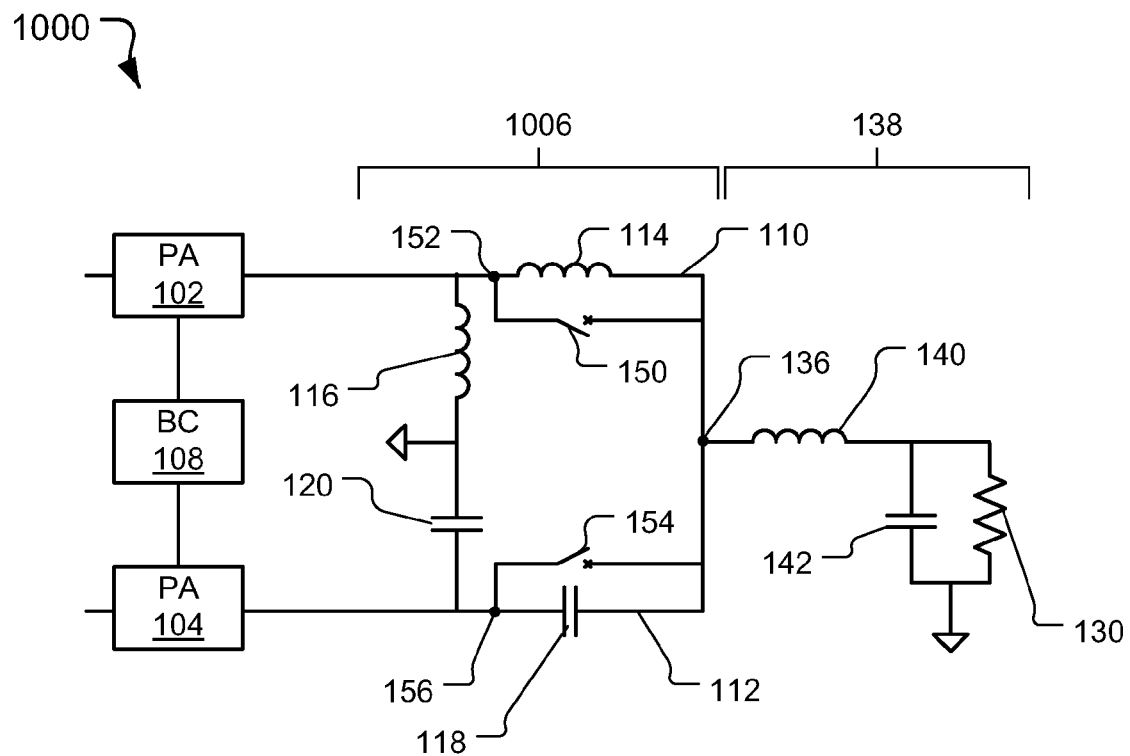
FIG. 11 is a circuit diagram of the apparatus of FIG. 10 operating in a high-power mode in accordance with various embodiments.

For operating in the high-power mode, the first power amplifier 102 and the second power amplifier 104 may be biased, and the switches 150, 154 may be switched to the open position, as illustrated in FIG. 11, providing an operational configuration similar to that illustrated in FIGS. 3 and 5.

Figure 12:
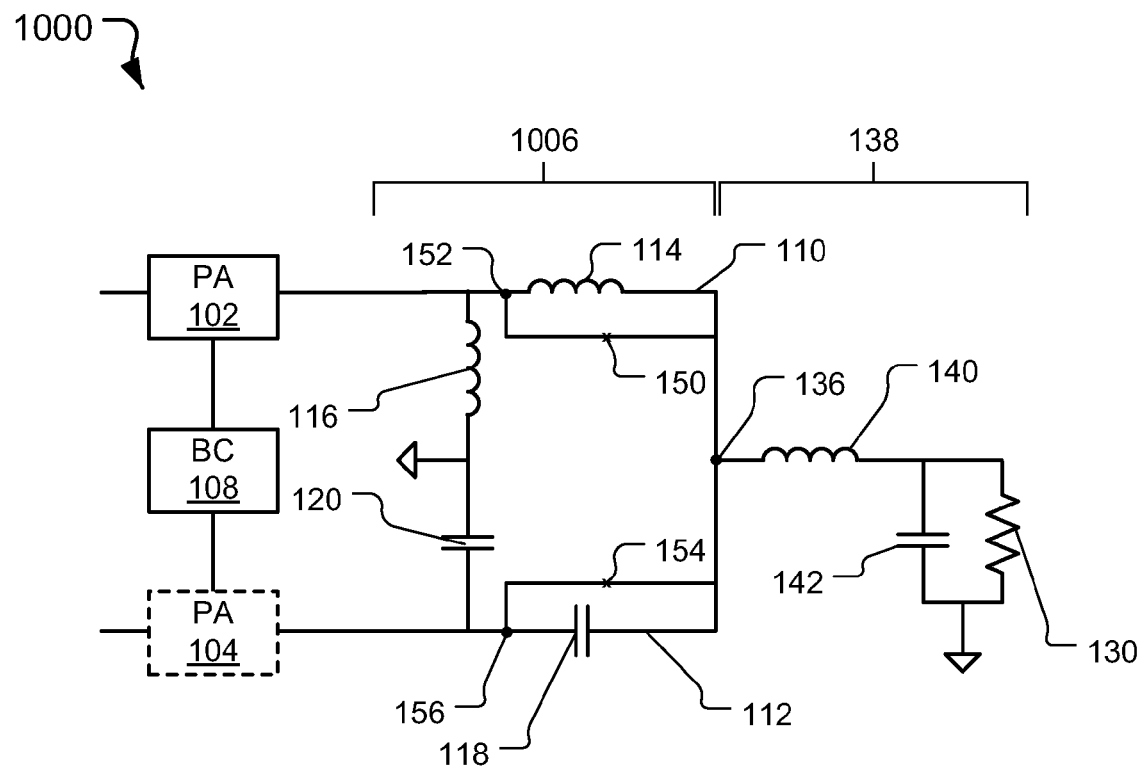
FIG. 12 is a circuit diagram of the apparatus of FIG. 10 operating in a medium-power mode in accordance with various embodiments.

For operating at various power levels below $p_{max}$, switches 150, 154 of the apparatus 1000 may be switched to the closed position, as illustrated in FIG. 12. The first power amplifier 102 may be biased by the biasing circuit 108, and the second power amplifier 104 may be unbiased (illustrated by hashed lines). Switching switches 150, 154 to the closed position couples the node 152 to the output node 136, and node 156 to the output node 136, respectively. In this operational configuration, the output node 136 is effectively source-driven by the first power amplifier 102.

Figure 13:
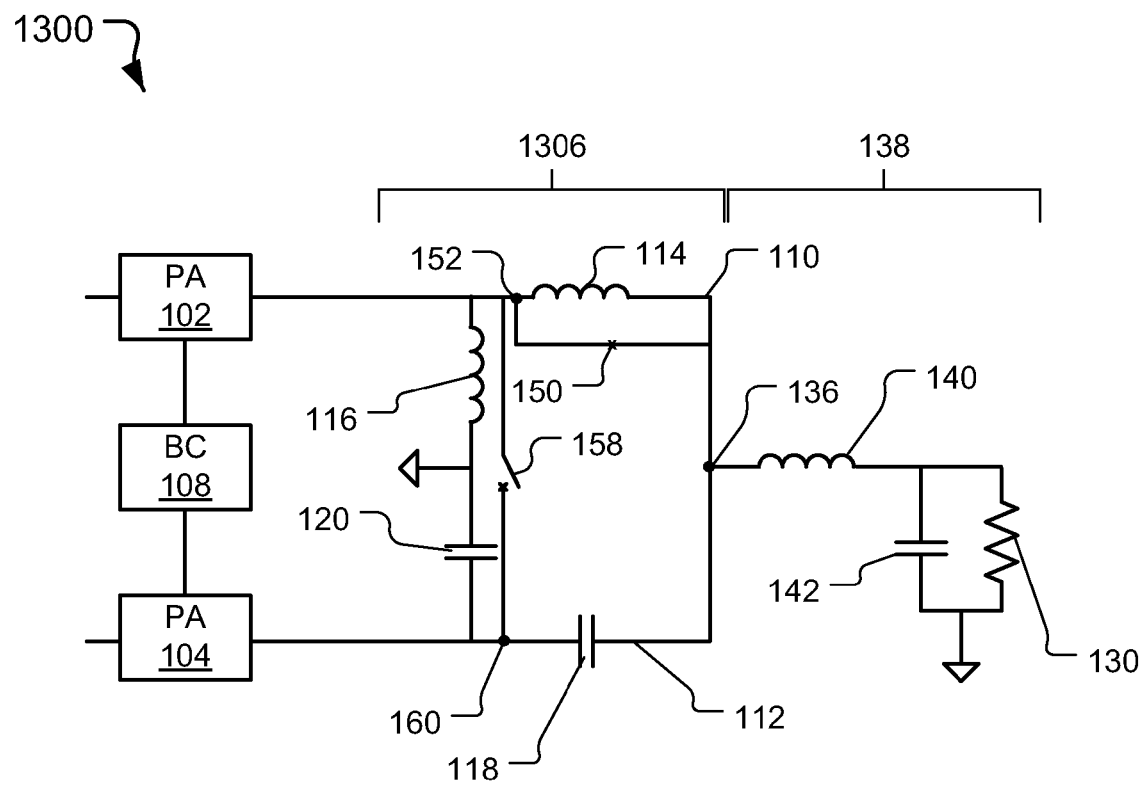
FIG. 13 is a circuit diagram of an apparatus including a quadrature lattice matching circuit in accordance with various embodiments.

FIG. 13 illustrates another embodiment of an apparatus 1300 including a quadrature lattice matching network 1306 configured to operate at various power levels including at or near $p_{max}$ and/or below $p_{max}$. As illustrated, the apparatus 1300 may include many elements similar to those illustrated in previous Figures, including, for example, a first power amplifier 102, a second power amplifier 104, and the quadrature lattice matching network 1306 including a first path 110 having a series inductor 114 and a shunt inductor 116, and a second path 112 having a series capacitor 118 and a shunt capacitor 120. The apparatus 1300 may also include an output matching circuit 138 to which a load 130 is coupled.

The apparatus 1300 may further include a switch 150 configured to selectively couple a node 152, between the series inductor 114 and the shunt inductor 116, with the output node 136. The apparatus 1300 may further include a switch 158 configured to selectively couple the node 152 to another node 160, which is between the series capacitor 118 and the shunt capacitor 120.

Figure 14:
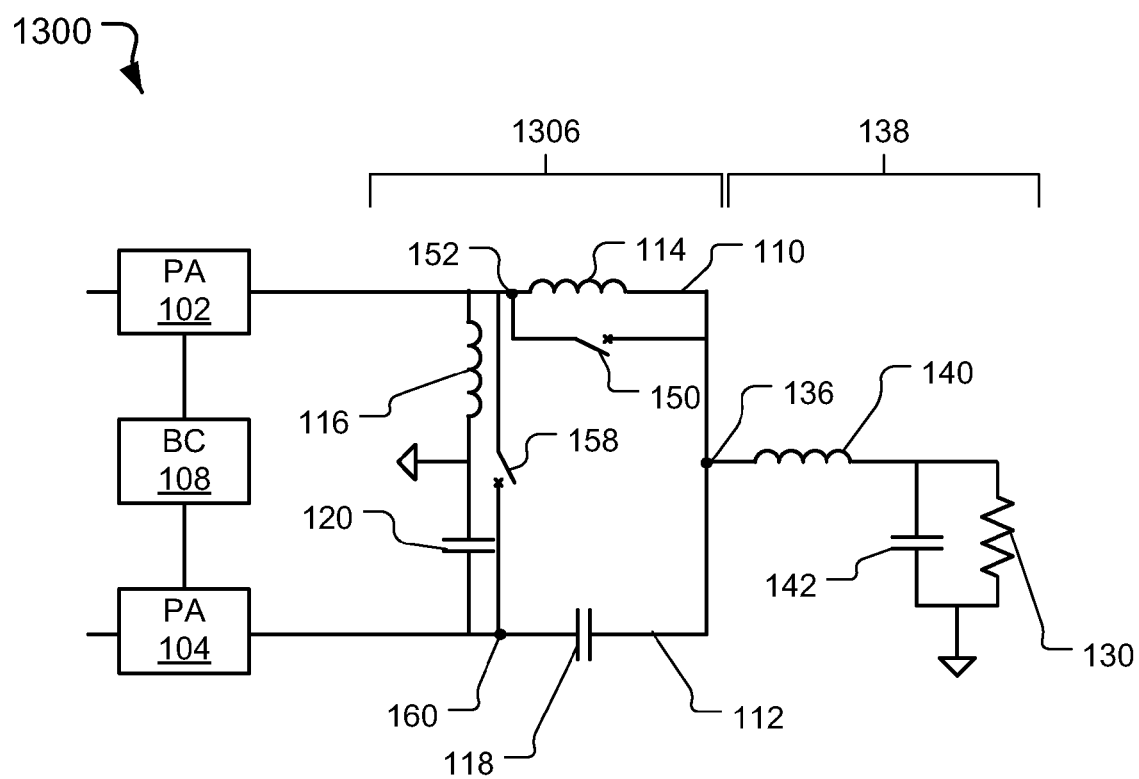
FIG. 14 is a circuit diagram of the apparatus of FIG. 13 operating in a high-power mode in accordance with various embodiments.

For operating in the high-power mode, the first power amplifier 102 and the second power amplifier 104 may be biased, and the switches 150 and 158 may be switched to the open positions, as illustrated in FIG. 14.

Figure 15:
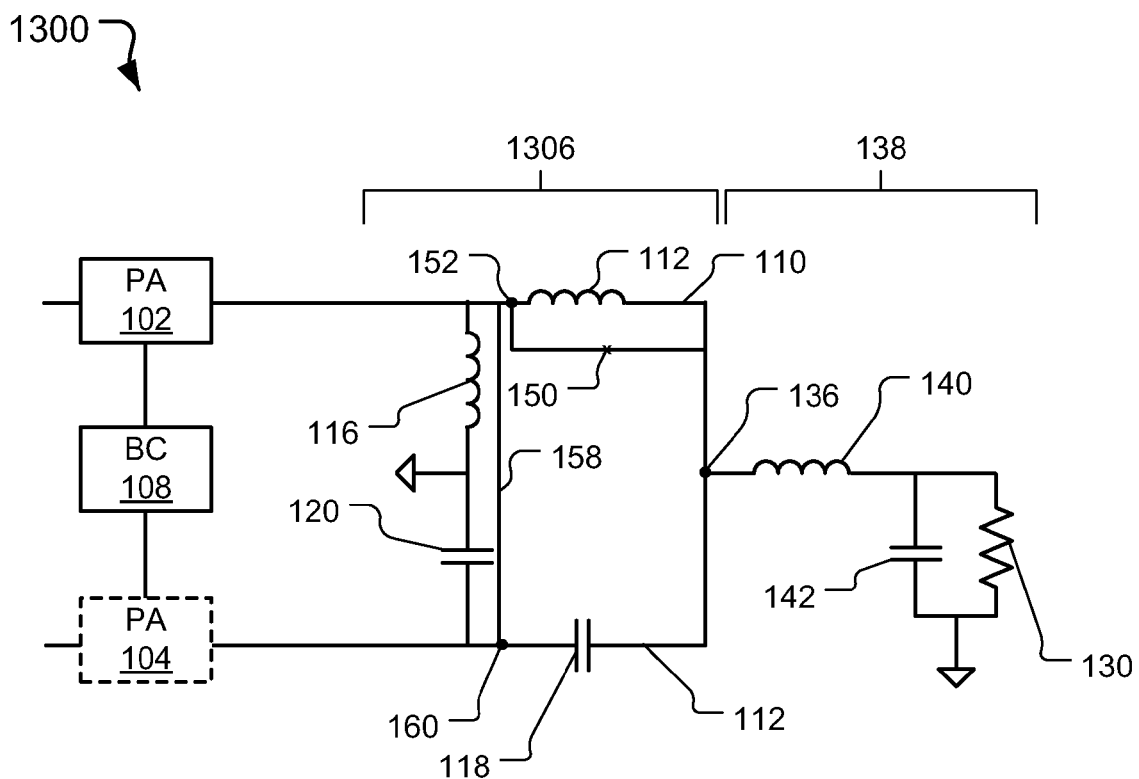
FIG. 15 is a circuit diagram of the apparatus of FIG. 13 operating in a medium-power mode in accordance with various embodiments.

For operating at various power levels below $p_{max}$, the switches 150 and 158 of the apparatus 1300 may be switched to their closed positions, as illustrated in FIG. 15. The first power amplifier 102 may be biased, and the second power amplifier 104 may be unbiased (illustrated by hashed lines). Switching switches 150 and 158 to their closed positions couples the node 152 to the output node 136 and the node 160 between capacitors 120 and 118.

Figure 16:
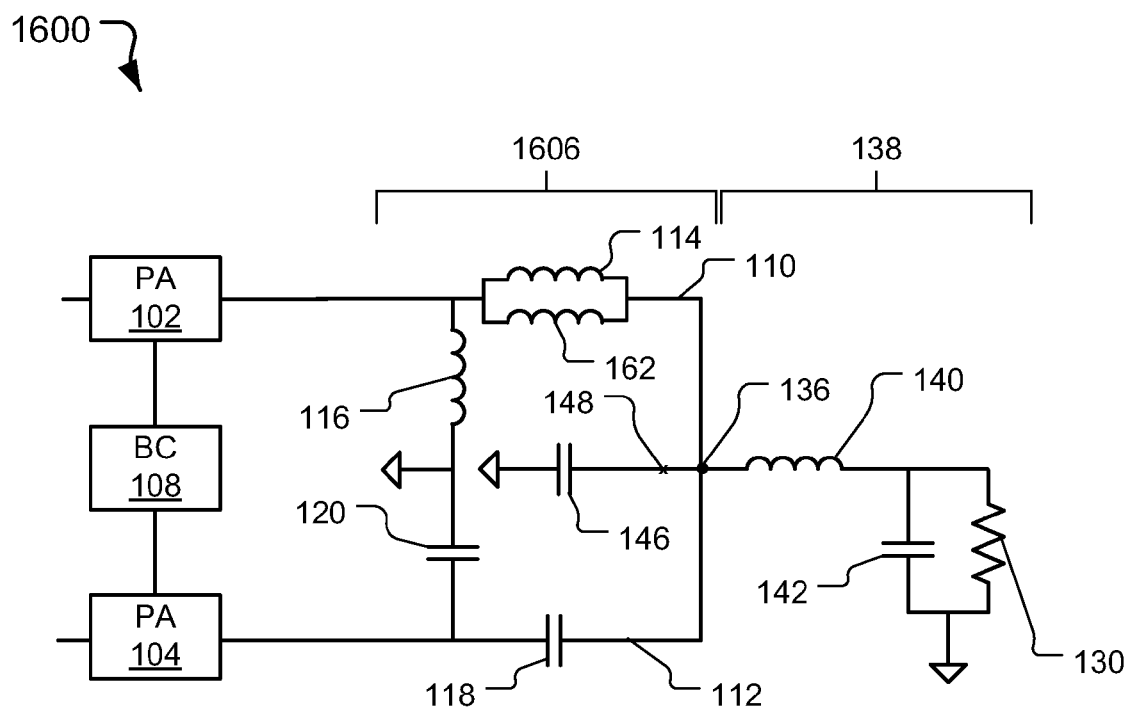
FIG. 16 is a circuit diagram of another apparatus including a quadrature lattice matching circuit in accordance with various embodiments.

FIG. 16 illustrates another embodiment of an apparatus 1600 including a quadrature lattice matching network 1606 configured to operate at various power levels including at or near $p_{max}$ and/or below $p_{max}$. As illustrated, the apparatus 1600 may include many elements similar to those illustrated in previous Figures, including, for example, a first power amplifier 102, a second power amplifier 104, and the quadrature lattice matching network 1606 including a first path 110 having a series inductor 114 and a shunt inductor 116, and a second path 112 having a series capacitor 118 and a shunt capacitor 120. The apparatus 1600 may also include an output matching circuit 138 to which a load 130 is coupled.

The apparatus 1600 may further include another inductor 162 configured to be selectively coupled in parallel with the series inductor 114. Although not illustrated, the apparatus 1600 may include one or more switches configured for selectively coupling the inductor 162 in parallel with the series inductor 114.

The apparatus 1600 may further include a capacitor 146 selectively coupled with the output node 136 of the quadrature lattice matching network 1206. The apparatus 1600 may include a switch 148 for selectively coupling the capacitor 146 with the node 136.

Figure 17:
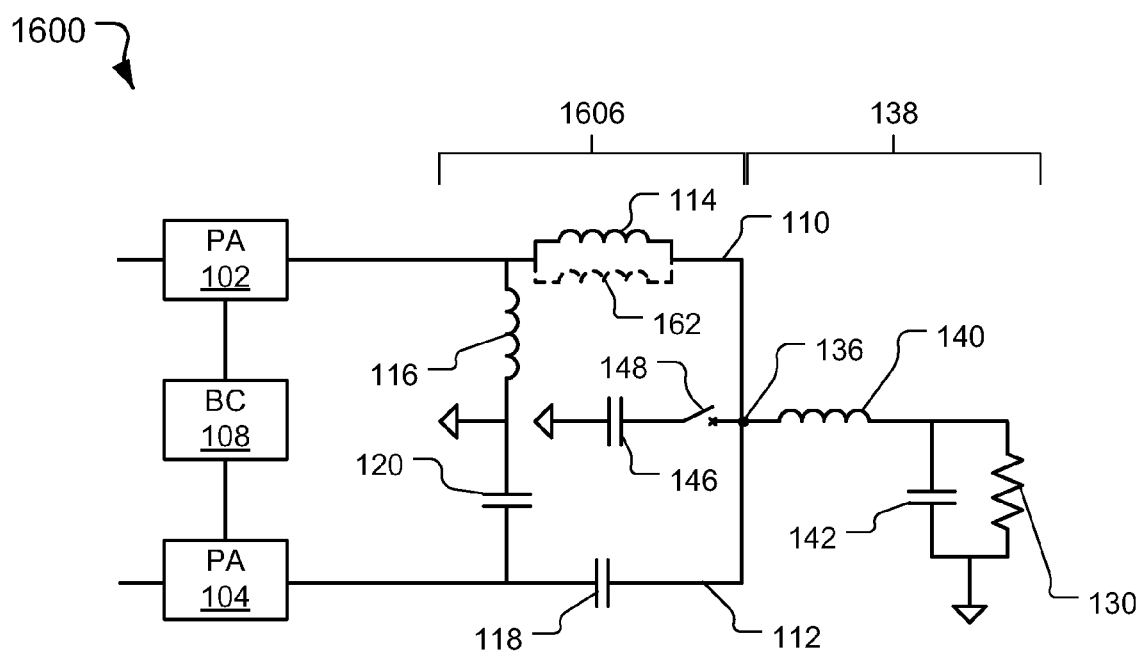
FIG. 17 is a circuit diagram of the apparatus of FIG. 16 operating in a high-power mode in accordance with various embodiments.

For operating in the high-power mode, the first power amplifier 102 and the second power amplifier 104 may be biased, and the inductor 162 may be switched off (illustrated by hashed lines) or otherwise disconnected from the series inductor 114, as illustrated in FIG. 17. The capacitor 146 may also be de-coupled from the output node 136 by switching the switch 148 to the open position.

Figure 18:
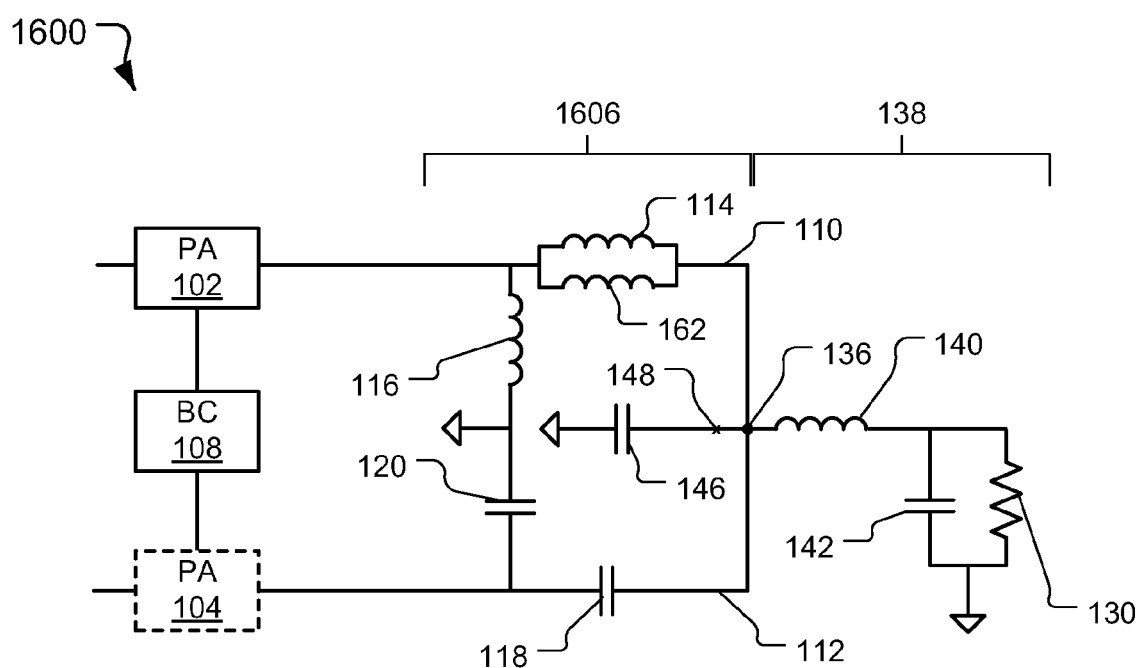
FIG. 18 is a circuit diagram of the apparatus of FIG. 16 operating in a medium-power mode in accordance with various embodiments.

For operating at various power levels below $p_{max}$, the first power amplifier 102 may be biased, the second power amplifier 104 may be unbiased (illustrated by hashed lines), and the inductor 162 may be coupled in parallel with the series inductor 114, as illustrated in FIG. 18.

In various embodiments, the switch 148 may be switched to the closed position, coupling the capacitor 146 to the output node 136 of the quadrature lattice power matching network 1606. In other embodiments, the un-biased power amplifier 104 may provide sufficient shunt capacitance, in which case the switch 148 may be switched to the open position, de-coupling the capacitor 146 to the output node 136 of the quadrature lattice power matching network 1606.

Figure 19:
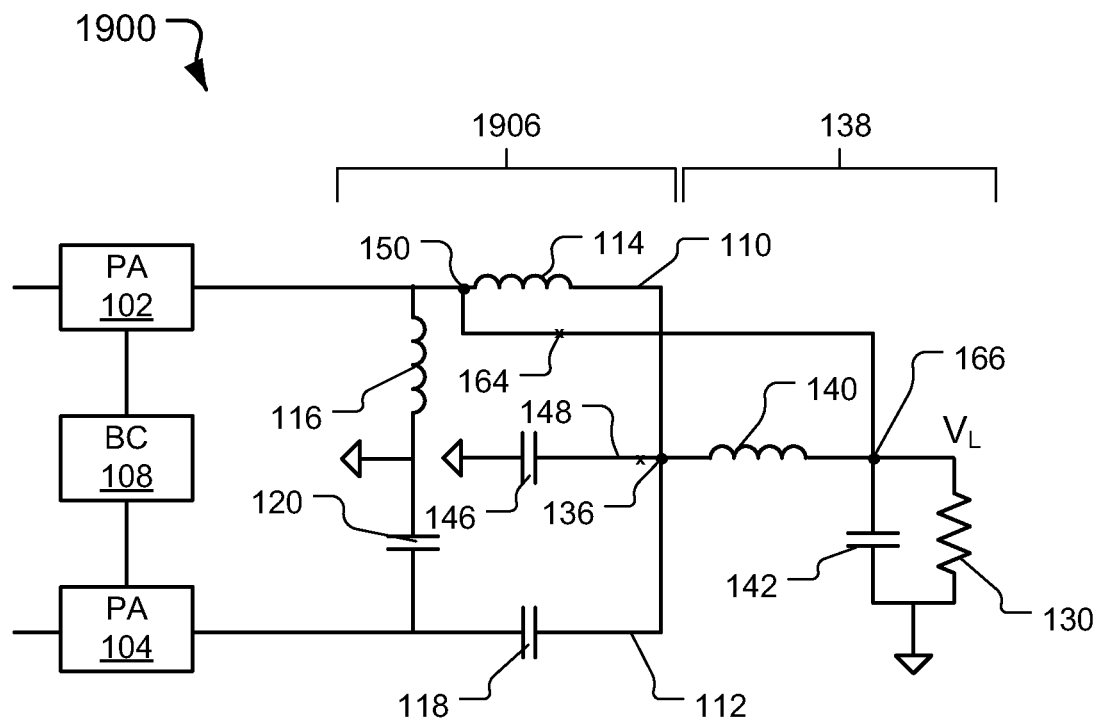
FIG. 19 is a circuit diagram of another apparatus including a quadrature lattice matching circuit in accordance with various embodiments.

FIG. 19 illustrates an embodiment of an apparatus 1900 including a quadrature lattice matching network 1906 configured to operate at various power levels including at or near $p_{max}$ and/or below $p_{max}$. As illustrated, the apparatus 1900 may include many elements similar to those illustrated in previous Figures, including, for example, a first power amplifier 102, a second power amplifier 104, and the quadrature lattice matching network 1906 including a first path 110 having a series inductor 114 and a shunt inductor 116, and a second path 112 having a series capacitor 118 and a shunt capacitor 120. The apparatus 1900 may also include an output matching circuit 138 comprising an output inductor 140 coupled with an output capacitor 142 and a load 130, with the output capacitor 142 and the load 130 coupled in parallel. A capacitor 146 may be selectively coupled with the output node 136 of the quadrature lattice matching network 1906, along with an output matching circuit 138 to which a load 130 is coupled. The capacitor 146 may be selectively coupled with the output node 136 by a switch 148.

The apparatus 1900 may further include a switch 164 configured to selectively couple the node 150, between the series inductor 114 and the shunt inductor 116, with a node 166 between the output inductor 140 and the output capacitor 142 and the load 130.

Figure 20:
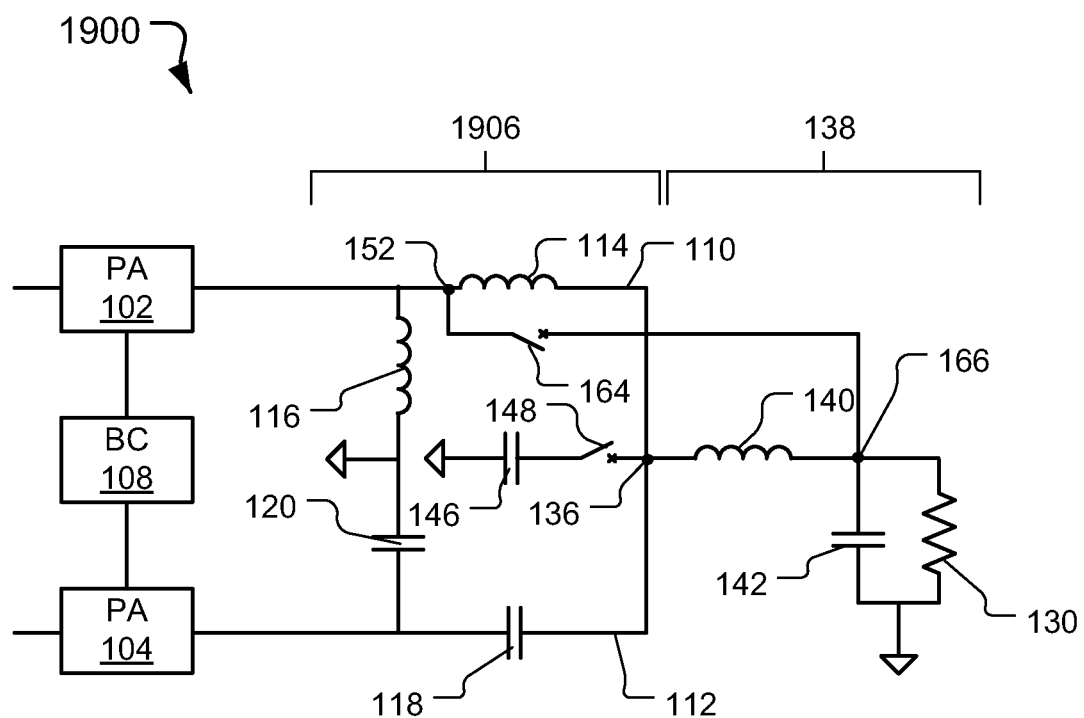
FIG. 20 is a circuit diagram of the apparatus of FIG. 19 operating in a high-power mode in accordance with various embodiments.

For operating in the high-power mode, the first power amplifier 102 and the second power amplifier 104 may be biased, the switch 164 may be switched to an open position, and the switch 148 may be switched to a closed as illustrated in FIG. 20.

Figure 21:
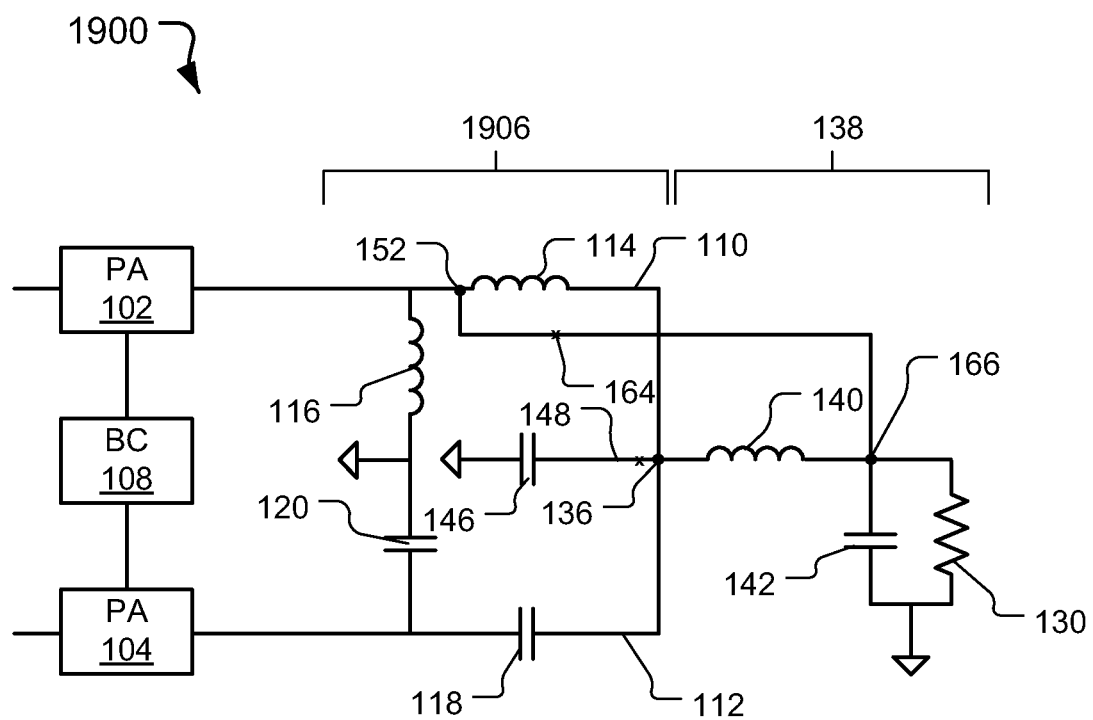
FIG. 21 is a circuit diagram of the apparatus of FIG. 19 operating in a medium-power mode in accordance with various embodiments.

For operating at various power levels below $p_{max}$, the first power amplifier 102 may be biased by the biasing circuit 108, the second power amplifier 104 may be unbiased (illustrated by hashed lines), the switch 164 may be switched to the closed position, and the switch 148 may be switched to the open position, as illustrated in FIG. 21. Switching switch 164 to the closed position couples the node 152 with the node 166. Switching switch 148 to the open position reduces the parallel capacitance across the load 130. In this embodiment, the output of the first power amplifier 102 is essentially connected directly to the load.

FIGS. 22-36 illustrate various embodiments of apparatuses including quadrature lattice matching networks configured to selectively operate in high-power mode at or near a maximum output power ($p_{max}$) or at power levels below $p_{max}$. In various embodiments, the apparatuses may be configured to selectively operate at low-power mode power levels at least 10 dB below $p_{max}$.

Figure 22:
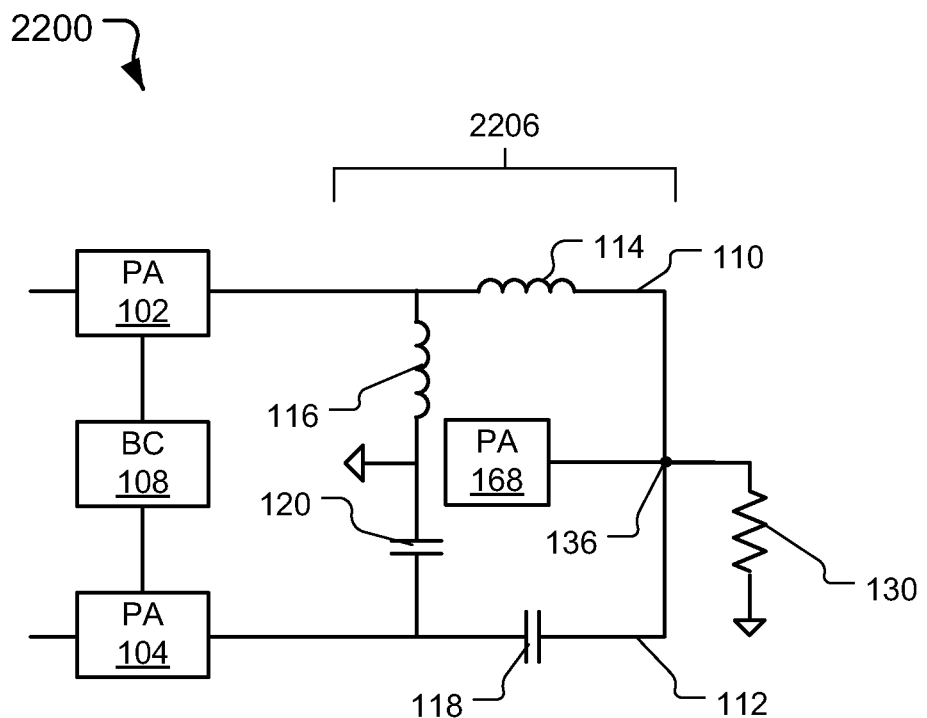
FIG. 22 is a circuit diagram of an apparatus including a quadrature lattice matching circuit in accordance with various embodiments.

As illustrated in FIG. 22, an apparatus 2200 may include many elements similar to those illustrated in previous Figures, including, for example, a first power amplifier 102, a second power amplifier 104, and a quadrature lattice matching network 2206 including a first path 110 having a series inductor 114 and a shunt inductor 116, and a second path 112 having a series capacitor 118 and a shunt capacitor 120. A load 130 may be coupled to the output node 136 of the quadrature lattice matching network 2206.

The apparatus 2200 further includes a third power amplifier 168 configured to be selectively biased. The third power amplifier 168 may be a low-power amplifier. In various embodiments, rather than selecting biasing the third power amplifier 168, the apparatus 2200 may include a switch (not illustrated) configured to selectively couple the third power amplifier 168 with the output node 136.

Figure 23:
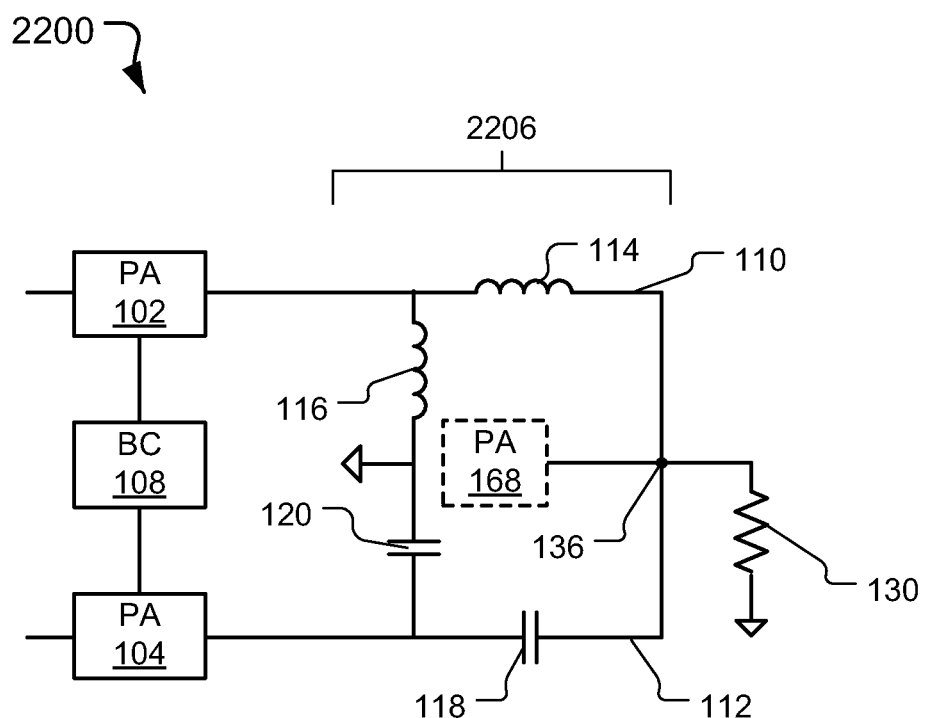
FIG. 23 is a circuit diagram of the apparatus of FIG. 22 operating in a high-power mode in accordance with various embodiments.

For operating in the high-power mode, the first power amplifier 102 and the second power amplifier 104 are biased by the biasing circuit 108, and the third power amplifier 168 is unbiased (illustrated by hashed lines), as illustrated in FIG. 23.

Figure 24:
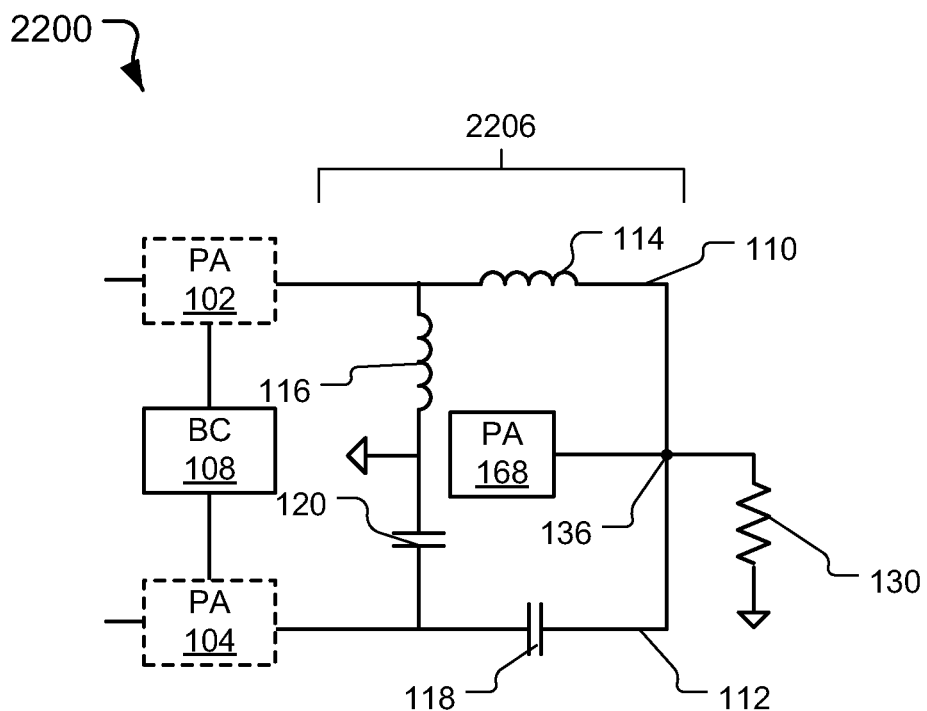
FIG. 24 is a circuit diagram of the apparatus of FIG. 22 operating in a low-power mode in accordance with various embodiments.

For operating at various power levels below $p_{max}$, the first power amplifier 102 and the second power amplifier 104 may be unbiased (illustrated by hashed lines), and the third power amplifier 168 may be biased, as illustrated in FIG. 24. In this operational configuration, the output of the third power amplifier 168 is fed directly, with little matching, to the load 130. Unbiasing the first power amplifier 102 and the second power amplifier 104 may cause the quadrature lattice matching network 2206 to form a high-impedance tank circuit at design frequency.

Figure 25:
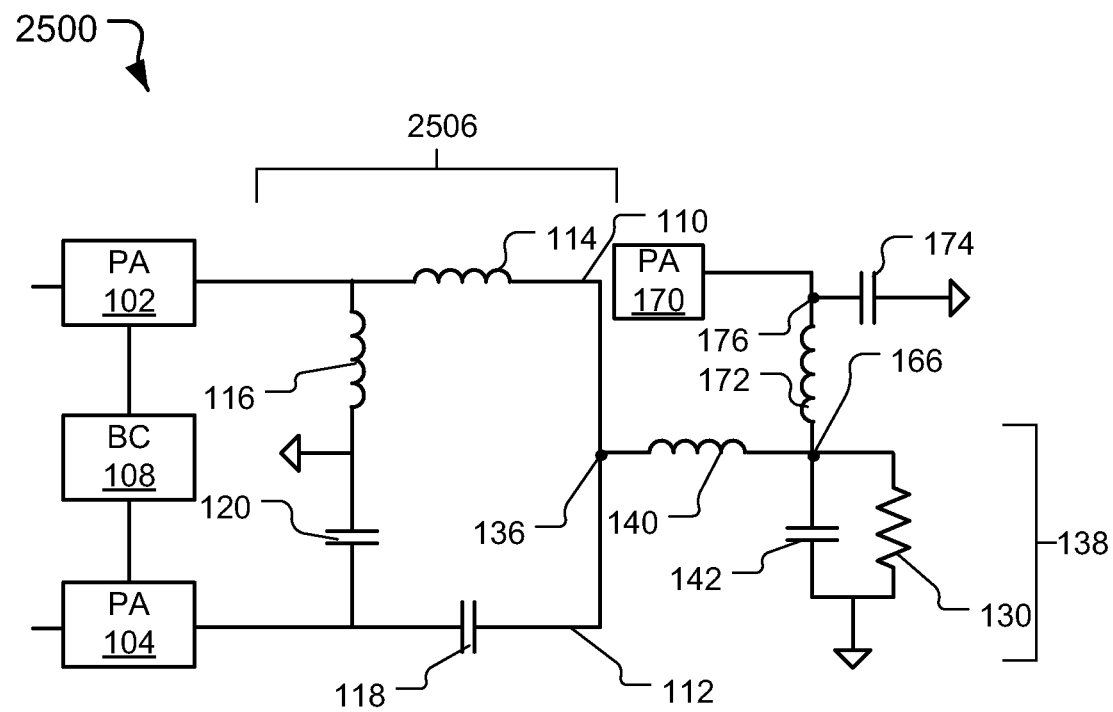
FIG. 25 is a circuit diagram of an apparatus including a quadrature lattice matching circuit in accordance with various embodiments.

FIG. 25 illustrates another embodiment of an apparatus 2500 including a quadrature lattice matching network 2506 configured to operate at various power levels including at or near $p_{max}$ and/or below $p_{max}$. As illustrated, the apparatus 2500 may include many elements similar to those illustrated in previous Figures, including, for example, a first power amplifier 102, a second power amplifier 104, and the quadrature lattice matching network 2506 including a first path 110 having a series inductor 114 and a shunt inductor 116, and a second path 112 having a series capacitor 118 and a shunt capacitor 120. The apparatus 2506 may also include an output matching circuit 138 comprising an output inductor 140 coupled with an output capacitor 142, with the output capacitor 142 and the load 130 coupled in parallel.

The apparatus 2500 further includes a third power amplifier 170 configured to be selectively biased. The third power amplifier 170 may be a low-power amplifier. In various embodiments, rather than selecting biasing the third power amplifier 170, the apparatus 2500 may include a switch (not illustrated) configured to selectively couple the third power amplifier 170 with the output matching circuit 138.

An inductor 172 and a capacitor 174 may be disposed between the third power amplifier 170 and the output matching circuit 138. The third power amplifier 170, the inductor 172, and the capacitor 174 may be coupled with one another at a node 176. The inductor 172 may in turn be coupled with a node 166 of the output matching circuit 138, the node 166 being further coupled with the output inductor 140, the output capacitor 142, and the load 130. In various embodiments, rather than the output matching circuit 138 illustrated, the load 130 may be directly coupled with the output node 136 as illustrated in FIG. 3. In these embodiments, the third power amplifier 170 may be configured to be selectively coupled to the output node 136 of the quadrature lattice matching network 2506.

Figure 26:
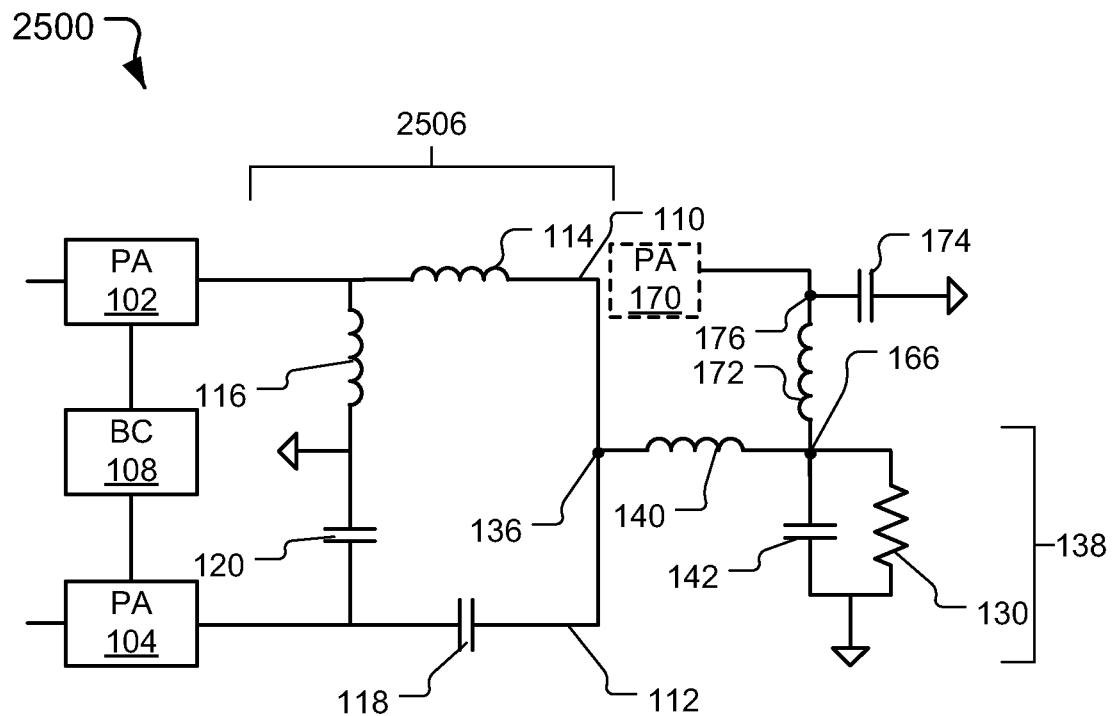
FIG. 26 is a circuit diagram of the apparatus of FIG. 25 operating in a high-power mode in accordance with various embodiments.

For operating in the high-power mode, the first power amplifier 102 and the second power amplifier 104 may be biased, and the third power amplifier 170 may be unbiased (illustrated by hashed lines), as illustrated in FIG. 26

Figure 27:
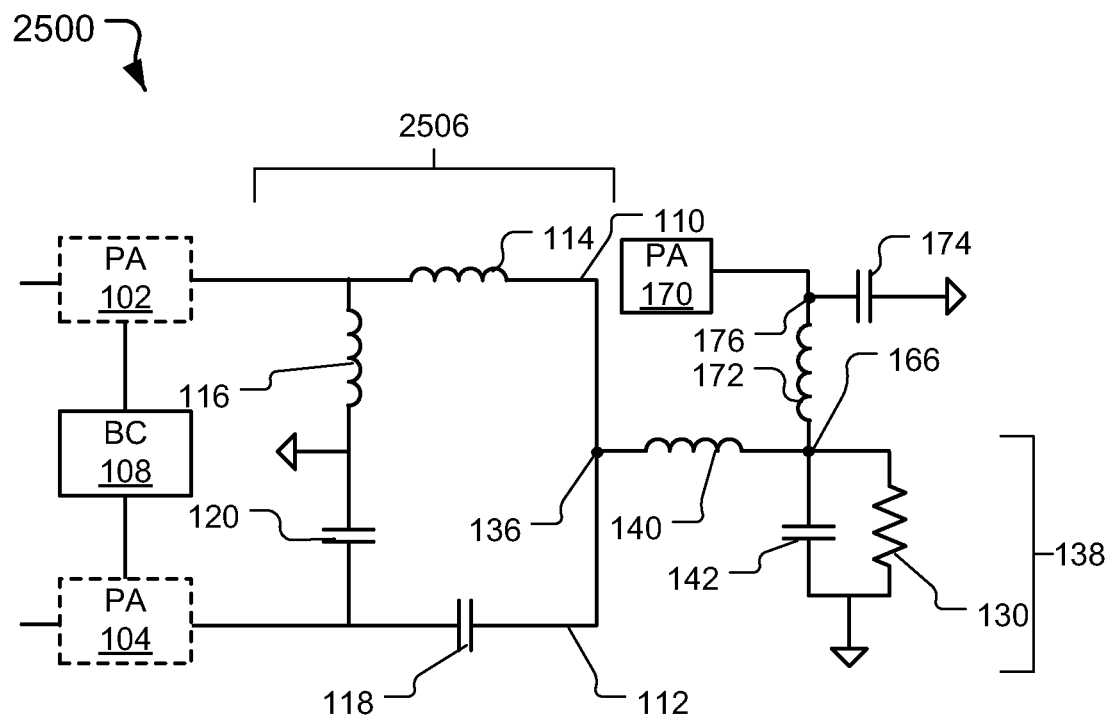
FIG. 27 is a circuit diagram of the apparatus of FIG. 25 operating in a low-power mode in accordance with various embodiments.

For operating at various power levels below $p_{max}$, the first power amplifier 102 and the second power amplifier 104 may be unbiased (illustrated by hashed lines), and the third power amplifier 170 may be biased, as illustrated in FIG. 27. In this operational configuration, the output of the third power amplifier 170 is fed directly, with little matching, to the load 130.

Figure 28:
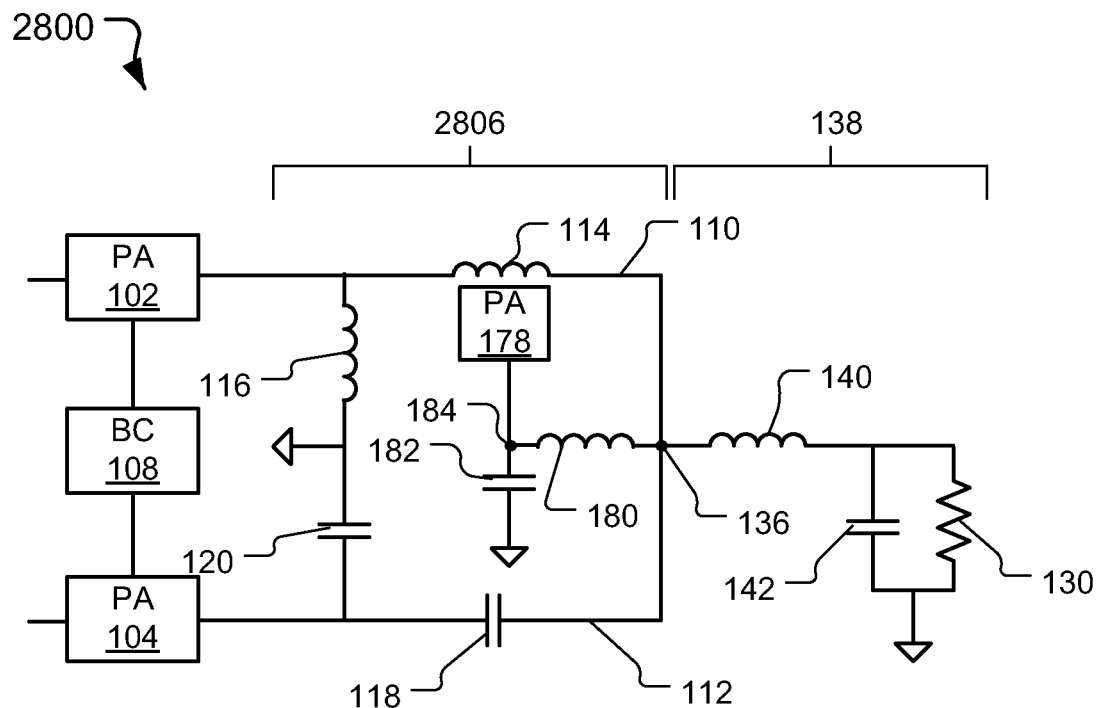
FIG. 28 is a circuit diagram of an apparatus including a quadrature lattice matching circuit in accordance with various embodiments.

FIG. 28 illustrates another embodiment of an apparatus 2800 including a quadrature lattice matching network 2806 configured to operate at various power levels including at or near $p_{max}$ and/or below $p_{max}$. As illustrated, the apparatus 2800 may include many elements similar to those illustrated in previous Figures, including, for example, a first power amplifier 102, a second power amplifier 104, and the quadrature lattice matching network 2806 including a first path 110 having a series inductor 114 and a shunt inductor 116, and a second path 112 having a series capacitor 118 and a shunt capacitor 120. The apparatus 2806 may also include an output matching circuit 138 comprising an output inductor 140 coupled with an output capacitor 142, with the output capacitor 142 and the load 130 coupled in parallel. Alternatively, the load 130 may be directly coupled with the output node 136 as illustrated in FIG. 3.

The apparatus 2800 may further include a third power amplifier 178 configured to be selectively biased. The third power amplifier 178 may be a low power amplifier. In various embodiments, rather than selecting biasing the third power amplifier 178, the apparatus 2800 may instead include a switch (not illustrated) configured to selectively couple the third power amplifier 178 with the output matching circuit 138.

Between the third power amplifier 178 and the output matching circuit 138 may be disposed an inductor 180 and a capacitor 182, wherein the third power amplifier 178 is coupled at a node 184 between the inductor 180 and the capacitor 182. The inductor 180 may in turn be coupled with the output node 136 of the quadrature lattice matching network 2806.

Figure 29:
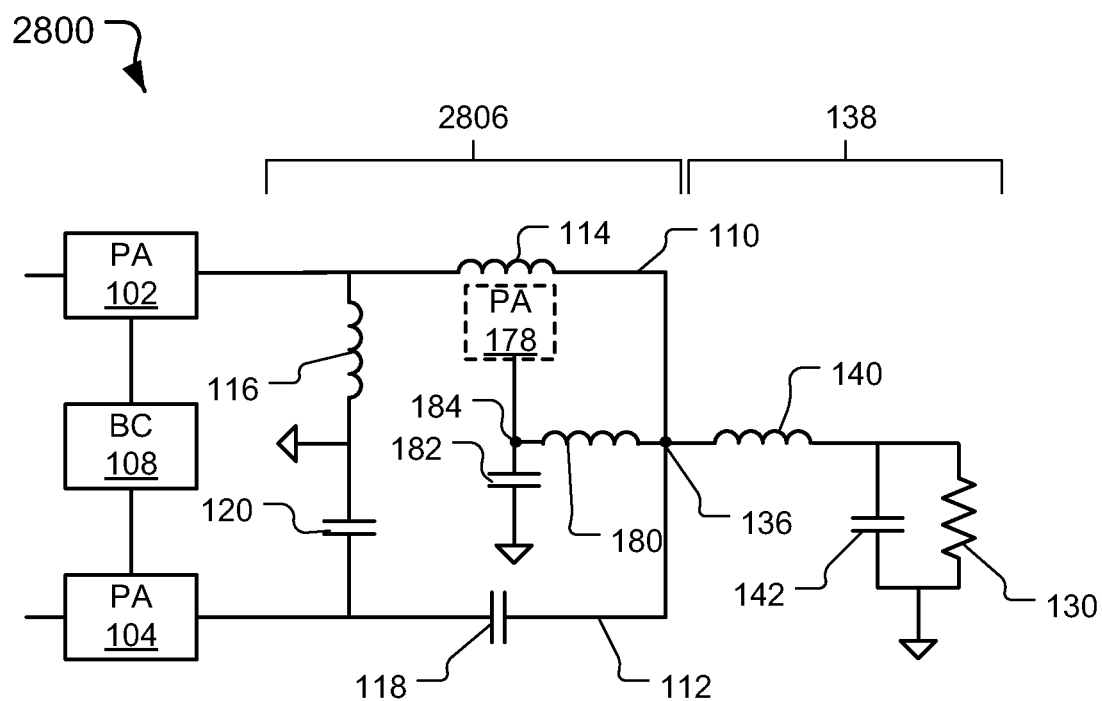
FIG. 29 is a circuit diagram of the apparatus of FIG. 28 operating in a high-power mode in accordance with various embodiments.

For operating in the high-power mode, the first power amplifier 102 and the second power amplifier 104 may be biased, and the third power amplifier 178 may be unbiased (illustrated by hashed lines), as illustrated in FIG. 29.

Figure 30:
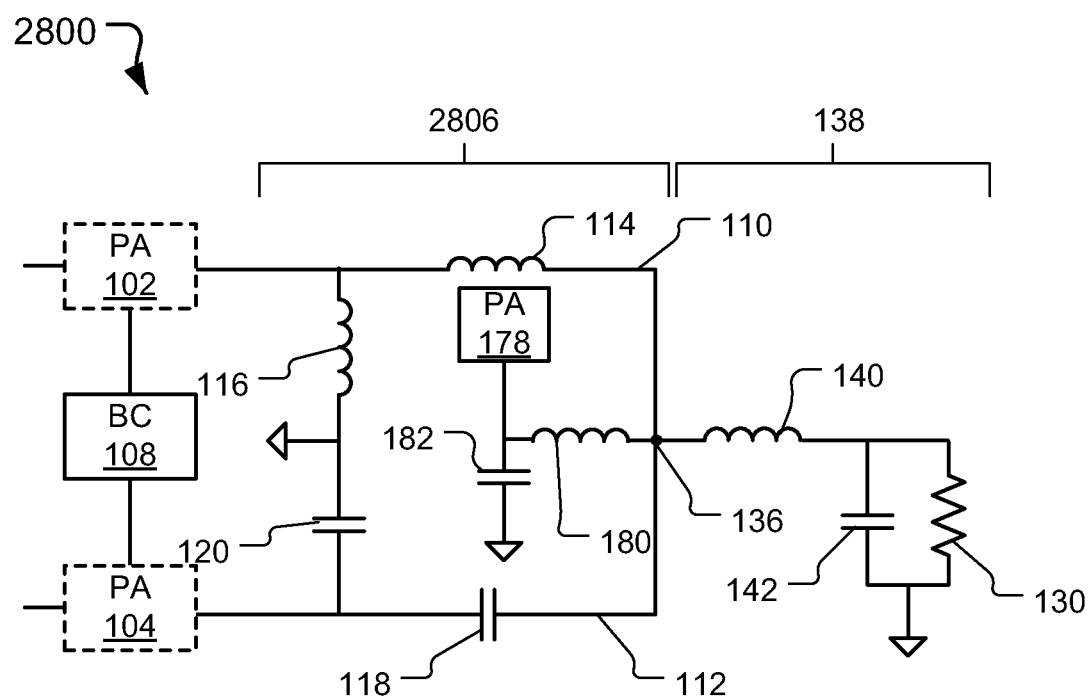
FIG. 30 is a circuit diagram of the apparatus of FIG. 28 operating in a low-power mode in accordance with various embodiments.

For operating at various power levels below $p_{max}$, the first power amplifier 102 and the second power amplifier 104 may be unbiased (illustrated by hashed lines), and the third power amplifier 178 may be biased, as illustrated in FIG. 30. In this operational configuration, the output of the third power amplifier 178 is fed directly, with little matching, to the load 130.

Figure 31:
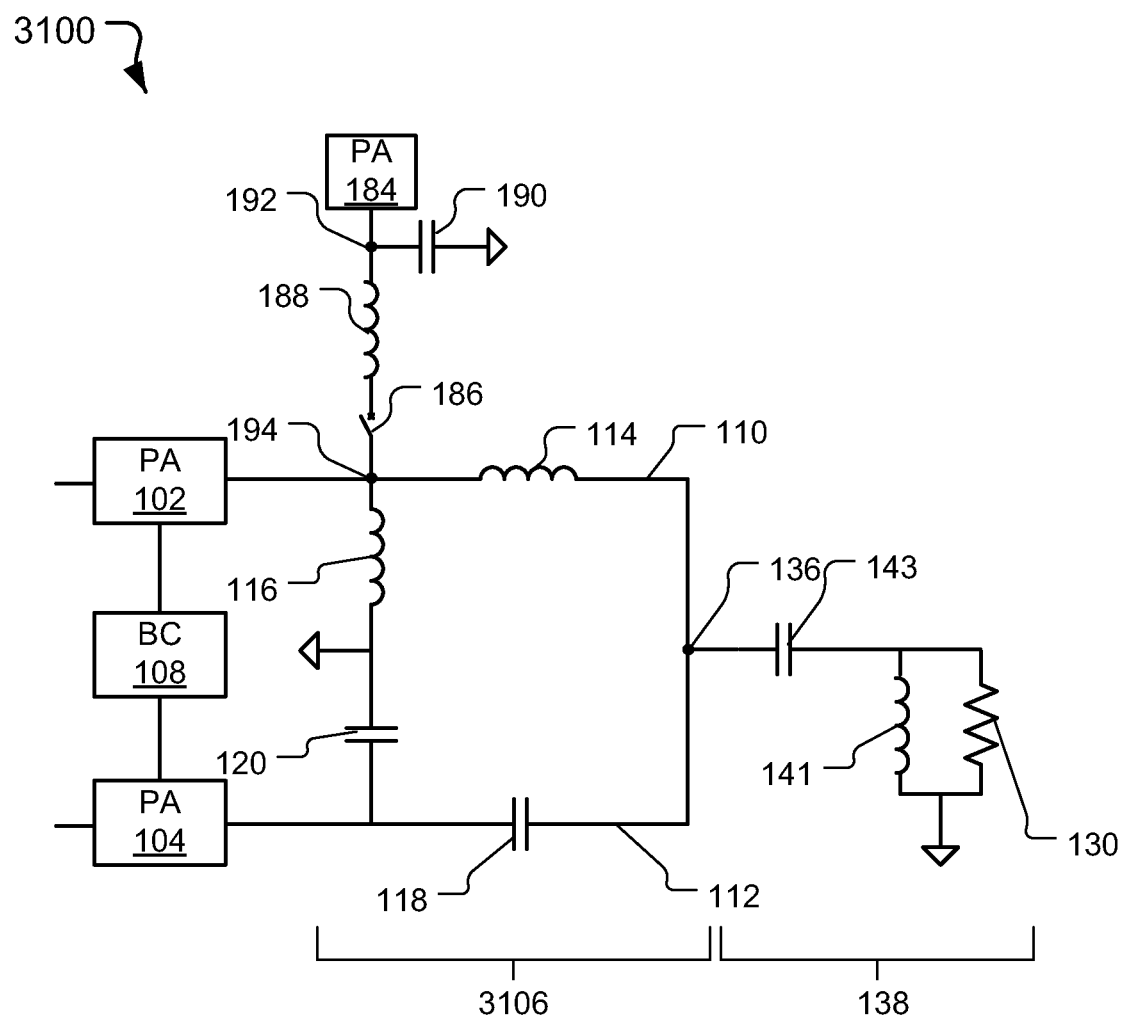
FIG. 31 is a circuit diagram of an apparatus including a quadrature lattice matching circuit in accordance with various embodiments.

FIG. 31 illustrates another embodiment of an apparatus 3100 including a quadrature lattice matching network 3106 configured to operate at various power levels including at or near $p_{max}$ and/or below $p_{max}$. As illustrated, the apparatus 3100 may include many elements similar to those illustrated in previous Figures, including, for example, a first power amplifier 102, a second power amplifier 104, and the quadrature lattice matching network 3106 including a first path 110 having a series inductor 114 and a shunt inductor 116, and a second path 112 having a series capacitor 118 and a shunt capacitor 120. The apparatus 3106 may also include an output matching circuit 138 comprising an output inductor 140 coupled with an output capacitor 142, with the output capacitor 142 and the load 130 coupled in parallel.

The apparatus 3100 further includes a third power amplifier 184 and a switch 186 configured to selectively couple the third power amplifier 184 with the output matching circuit 138. The third power amplifier 184 may be a low-power amplifier. In various embodiments, rather than selecting coupling the third power amplifier 184 to the output matching circuit 138, the apparatus 3100 may be configured to be selectively biased.

An inductor 188 and a capacitor 190 may be disposed between the third power amplifier 184 and the output matching circuit 138. The third power amplifier 184, the inductor 188, and the capacitor 190 may be coupled with one another at a node 192. The inductor 188 may in turn be coupled with a node 194 of the quadrature lattice matching network 3106. In various embodiments, rather than the output matching circuit 138 illustrated, the load 130 may be directly coupled with the output node 136 as illustrated in FIG. 3.

Figure 32:
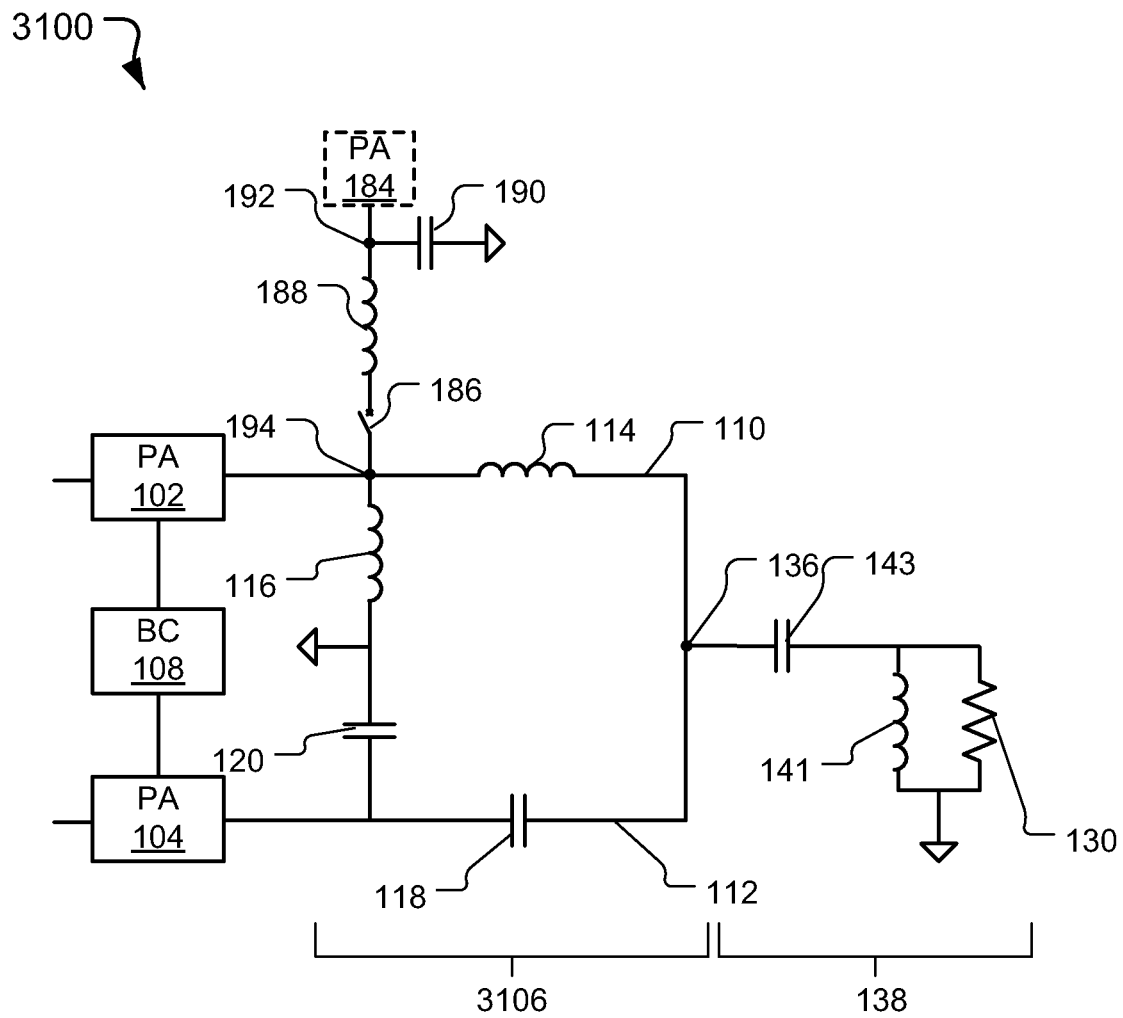
FIG. 32 is a circuit diagram of the apparatus of FIG. 31 operating in a high-power mode in accordance with various embodiments.

For operating in the high-power mode, the first power amplifier 102 and the second power amplifier 104 may be biased, and the third power amplifier 184 may be decoupled from the quadrature lattice matching network 3106, as illustrated in FIG. 32

Figure 33:
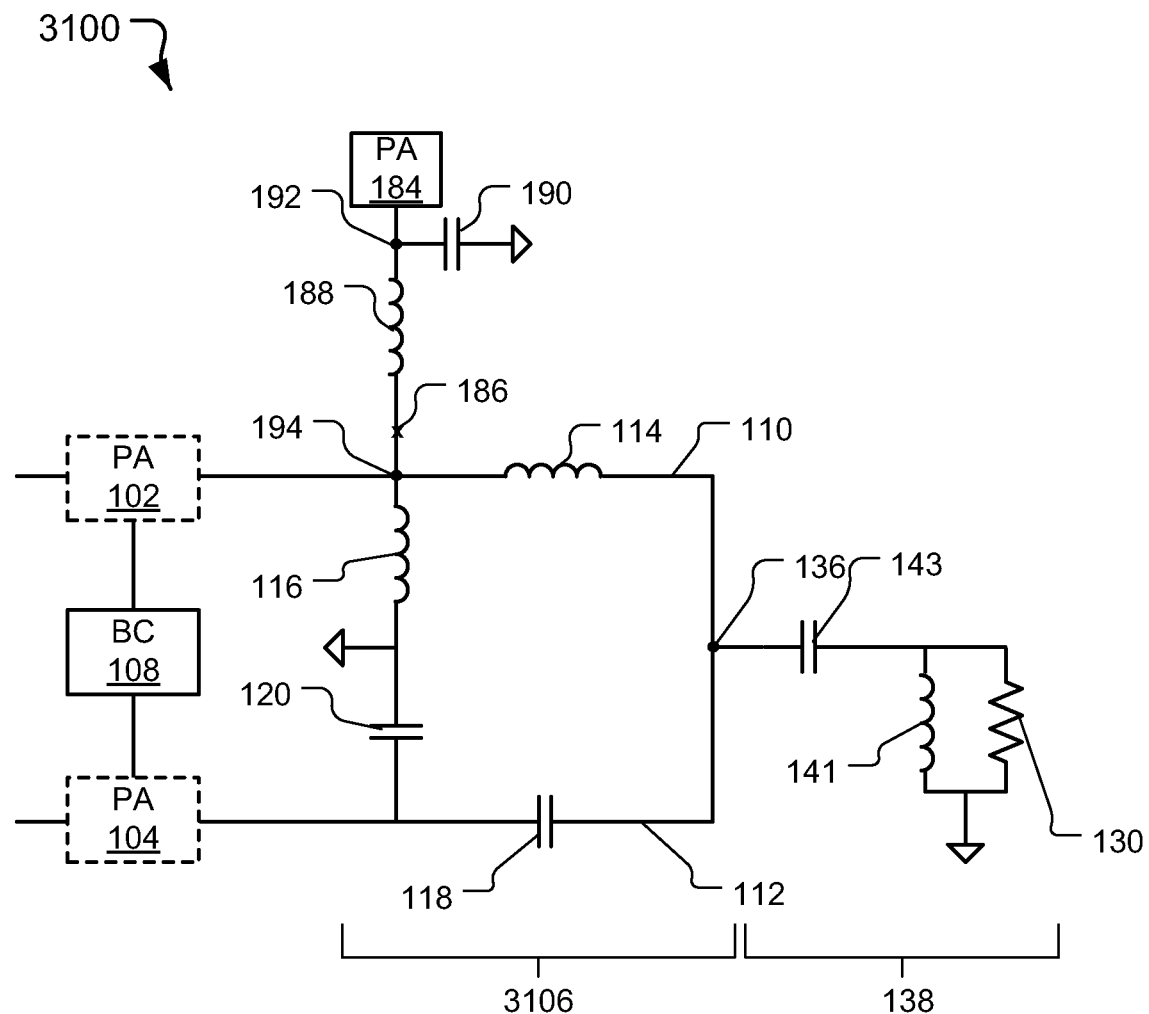
FIG. 33 is a circuit diagram of the apparatus of FIG. 31 operating in a low-power mode in accordance with various embodiments.

For operating at various power levels below $p_{max}$, the first power amplifier 102 and the second power amplifier 104 may be unbiased (illustrated by hashed lines), and the third power amplifier 184 may be biased, as illustrated in FIG. 33.

Figure 34:
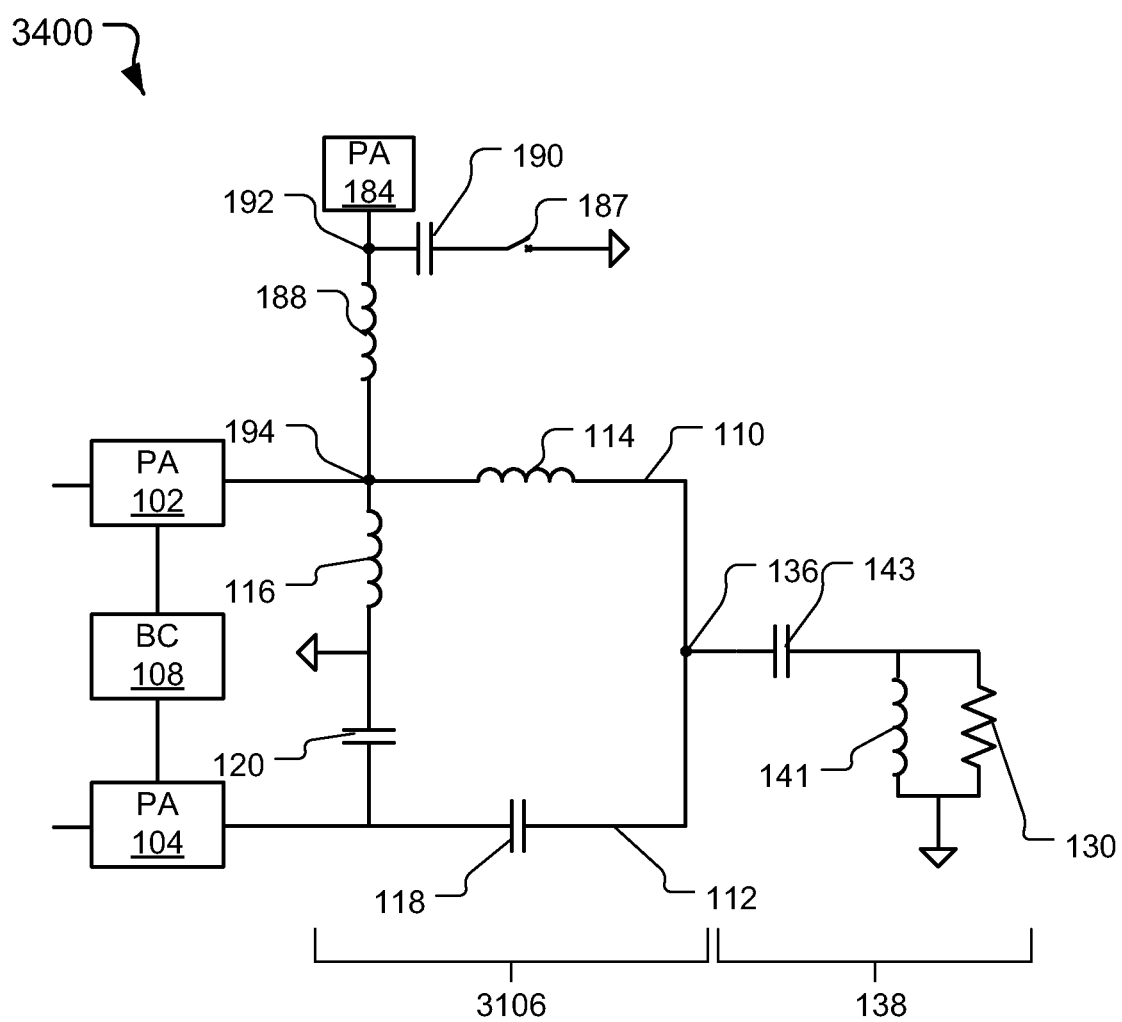
FIG. 34 is a circuit diagram of an apparatus including a quadrature lattice matching circuit in accordance with various embodiments.

In various embodiments, the architecture of FIGS. 31-33 may be modified such that the switch 186 located between the node 194 and the inductor 188 is replaced by a transmission line, and a switch 187 is instead located between the capacitor 190 and the ground as illustrated in FIG. 34. The apparatus 3400 of FIG. 34 may operate in a similar manner to that discussed above with respect to FIGS. 31-33 in that operating in the high-power mode operation may include biasing the first power amplifier 102 and the second power amplifier 104, and decoupling the third power amplifier 170 being from the quadrature lattice matching network 3106. Similarly, for operating at various power levels below $p_{max}$, the first power amplifier 102 and the second power amplifier 104 may be unbiased, and the third power amplifier 184 may be biased.

For the embodiment illustrated in FIG. 34, disconnecting the low-power arm of the circuit from ground may result in elimination of loading on the lattice 3106 from elements in the low-power arm when operating in the high-power mode. This approach may give a lower insertion loss than the series switch 186 connecting to the lattice 3106.

Figure 35:
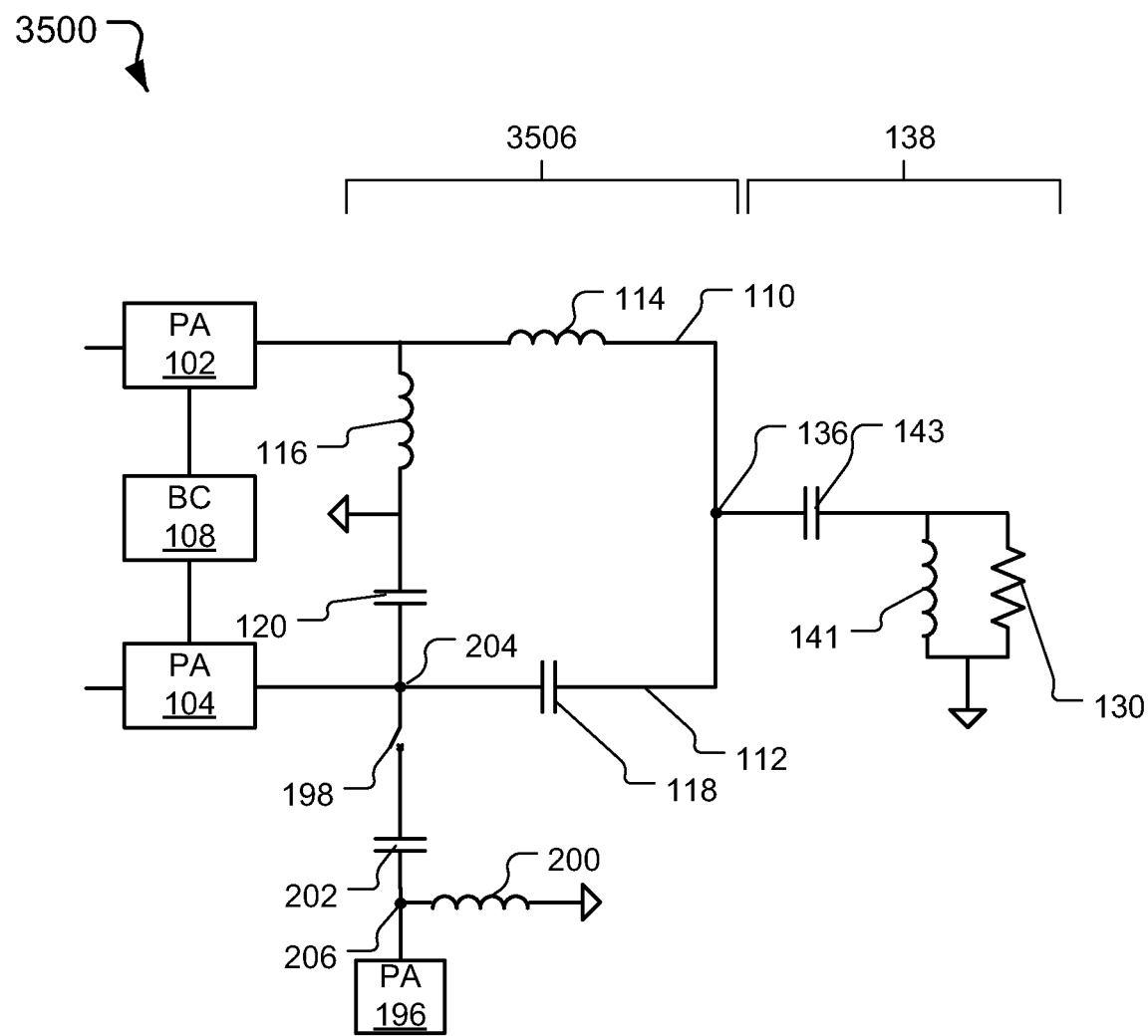
FIG. 35 is a circuit diagram of an apparatus including a quadrature lattice matching circuit in accordance with various embodiments.

FIG. 35 illustrates another embodiment of an apparatus 3500 including a quadrature lattice matching network 3506 configured to operate at various power levels including at or near $p_{max}$ and/or below $p_{max}$. As illustrated, the apparatus 3500 may include many elements similar to those illustrated in previous Figures, including, for example, a first power amplifier 102, a second power amplifier 104, and the quadrature lattice matching network 3506 including a first path 110 having a series inductor 114 and a shunt inductor 116, and a second path 112 having a series capacitor 118 and a shunt capacitor 120. The apparatus 3506 may also include an output matching circuit 138 comprising an output inductor 140 coupled with an output capacitor 142, with the output capacitor 142 and the load 130 coupled in parallel.

The apparatus 3500 further includes a third power amplifier 196 and a switch 198 configured to selectively couple the third power amplifier 196 with the output matching circuit 138. The third power amplifier 196 may be a low-power amplifier. In various embodiments, rather than selecting coupling the third power amplifier 196 to the output matching circuit 138, the apparatus 3500 may be configured to be selectively biased.

An inductor 200 and a capacitor 202 may be disposed between the third power amplifier 196 and the output matching circuit 138. The third power amplifier 196, the inductor 200, and the capacitor 202 may be coupled with one another at a node 206. The inductor 200 may in turn be coupled with a node 204 of the quadrature lattice matching network 3506. In various embodiments, rather than the output matching circuit 138 illustrated, the load 130 may be directly coupled with the output node 136.

Figure 36:
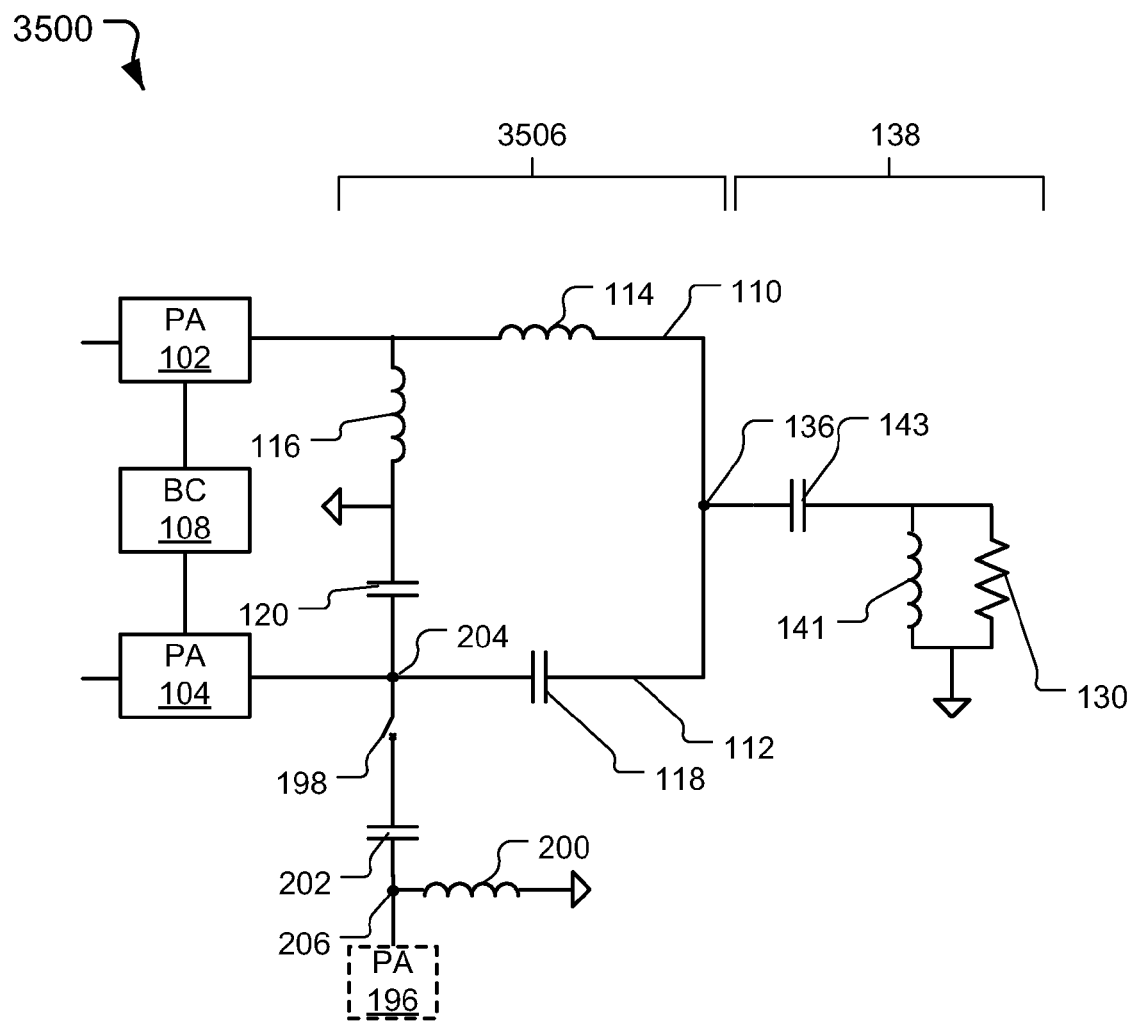
FIG. 36 is a circuit diagram of the apparatus of FIG. 35 operating in a high-power mode in accordance with various embodiments.

For operating in the high-power mode, the first power amplifier 102 and the second power amplifier 104 may be biased, and the third power amplifier 196 may be decoupled from the quadrature lattice matching network 3506, as illustrated in FIG. 36

Figure 37:
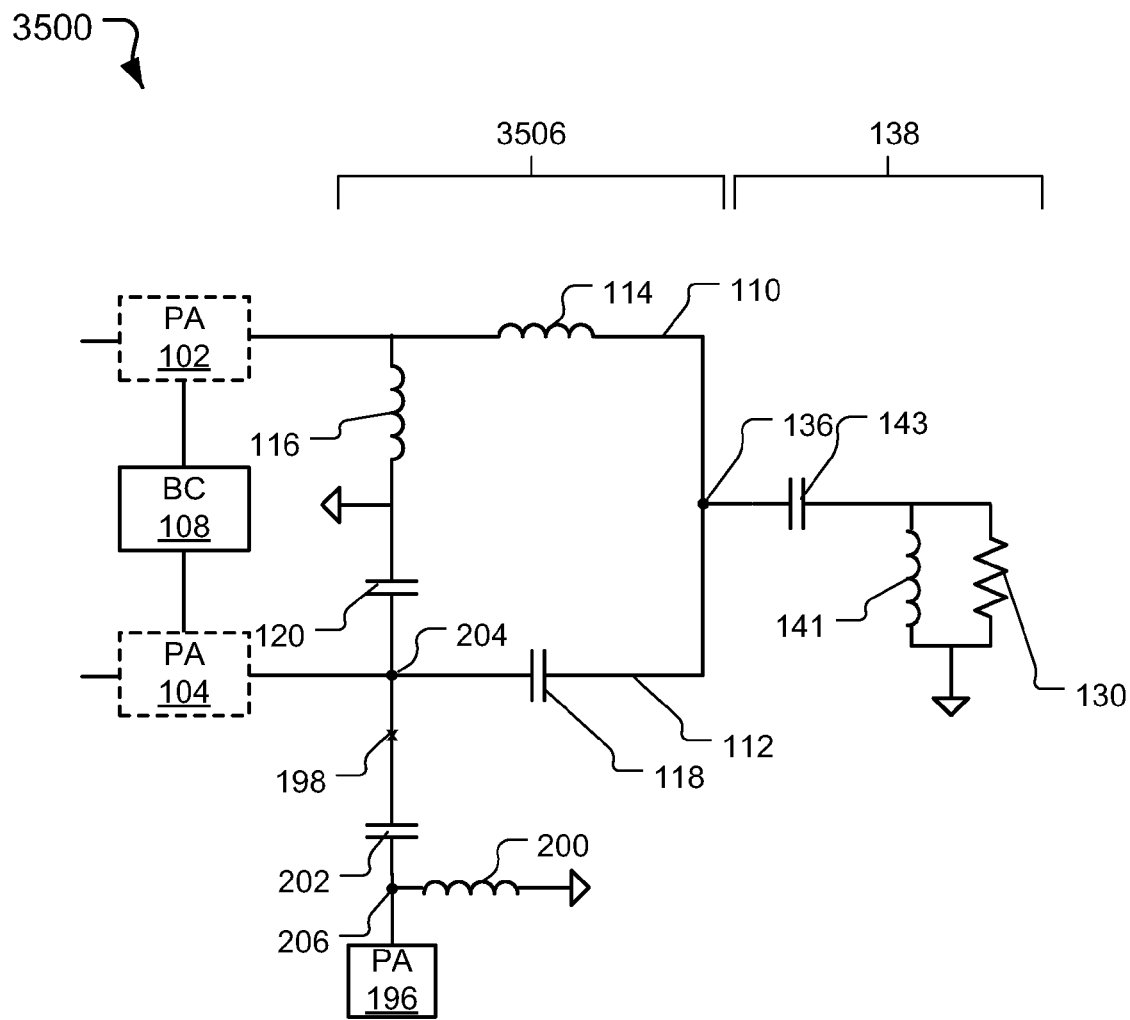
FIG. 37 is a circuit diagram of the apparatus of FIG. 35 operating in a low-power mode in accordance with various embodiments.

For operating at various power levels below $p_{max}$, the first power amplifier 102 and the second power amplifier 104 may be unbiased (illustrated by hashed lines), and the third power amplifier 196 may be biased, as illustrated in FIG. 37.

Figure 38:
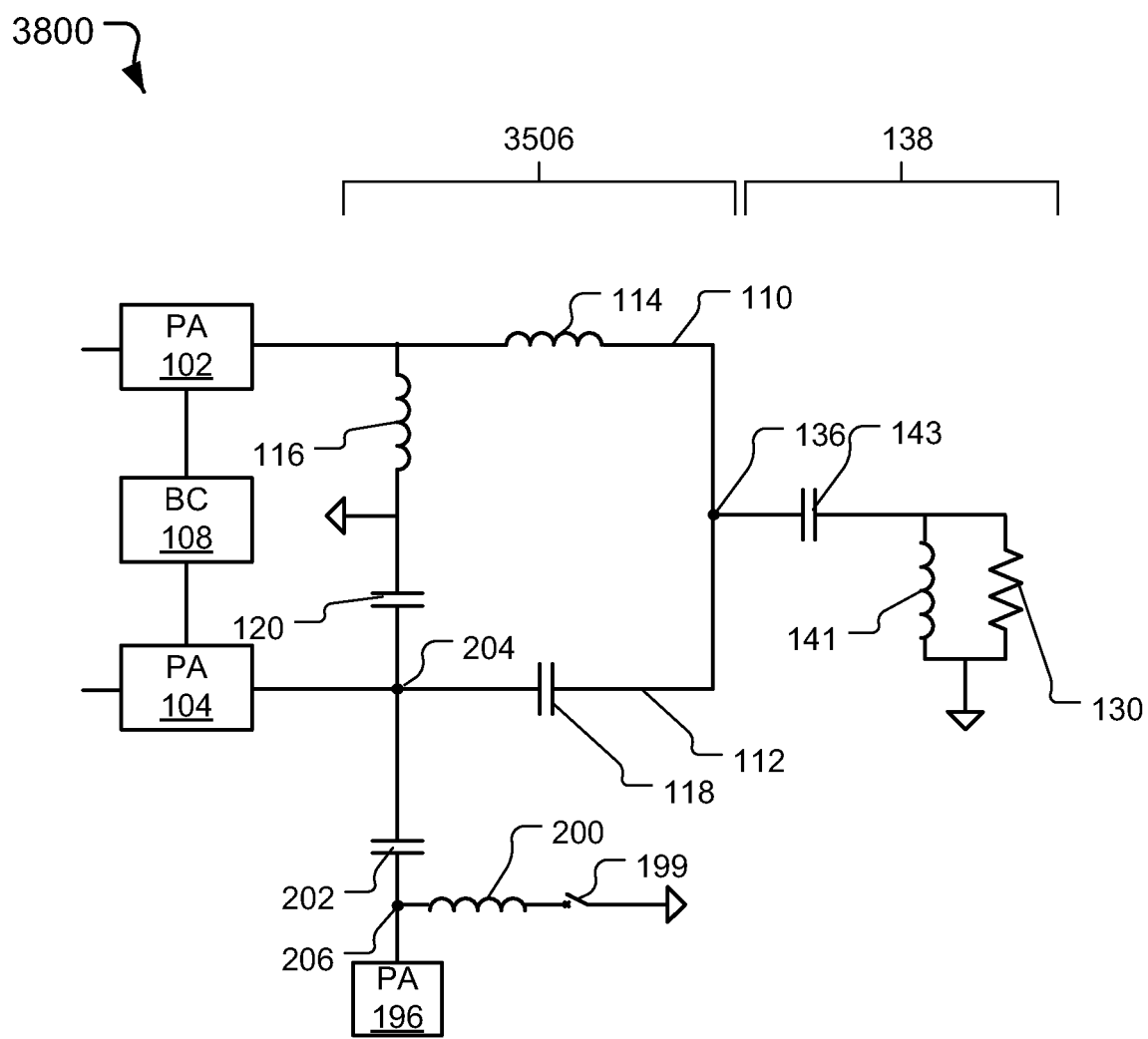
FIG. 38 is a circuit diagram of an apparatus including a quadrature lattice matching circuit in accordance with various embodiments.

In various embodiments, the architecture of FIGS. 35-37 may be modified such that the switch 198 located between the node 204 and the capacitor 202 is replaced by a transmission line, and a switch 199 is instead located between the inductor 20 and the ground as illustrated in FIG. 38 The apparatus 3800 of FIG. 38 may operate in a similar manner to that discussed above with respect to FIGS. 35-37 in that operating in the high-power mode operation may include biasing the first power amplifier 102 and the second power amplifier 104, and decoupling the third power amplifier 196 being from the quadrature lattice matching network 3506. Similarly, for operating at various power levels below $p_{max}$, the first power amplifier 102 and the second power amplifier 104 may be unbiased, and the third power amplifier 196 may be biased.

For the embodiment illustrated in FIG. 38, disconnecting the low-power arm of the circuit from ground may result in elimination of loading on the lattice 3506 from elements in the low-power arm when operating in the high-power mode. This approach may give a lower insertion loss than the series switch 186 connecting to the lattice 3506.

Figure 39:
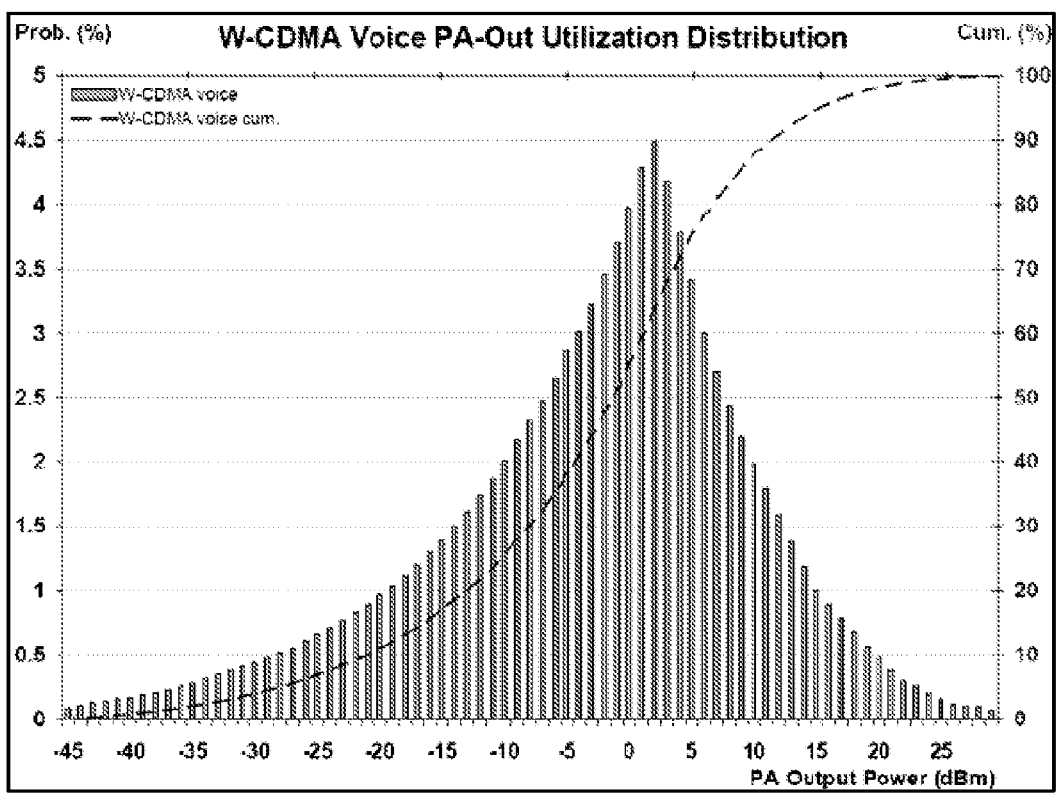
FIG. 39 illustrates a graph depicting W-CDMA output utilization distribution.

As discussed above, FIGS. 22-38 illustrate various embodiments of apparatuses configured to selectively operate in high-power mode at or near a maximum output power ($p_{max}$) or at one or more power levels below $p_{max}$. Among the benefits of the described embodiments is that increased efficiencies may be realized by selective operation in the low power mode. Operating in low-power mode may be important for in communications compliant with protocols that cause a communication device to operate in low-power mode for significant amounts of time. FIG. 39 illustrates an example voice PA-out utilization distribution for a device operating under the W-CDMA standard. As illustrated, the device may spend a significant amount of time at low power rather than high power. In fact, for the illustrated embodiment, the device has a transmit power of ≤16 dBm for more than 95% of the time.

The applications for the embodiments discussed herein with respect to FIGS. 22-38 may include, but are not limited to, HBT power amplifier dies, integrated passive device dies for output matching, and CMOS or pHEMT dies for bias switching.

Figure 40:
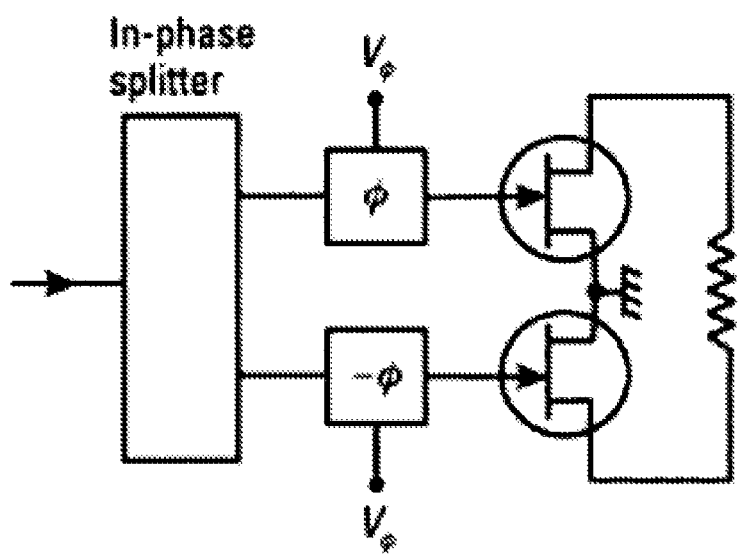
FIG. 40 is a related art Chireix architecture

In various embodiments, a quadrature combiner structure, which may comprise the quadrature lattice matching network 106 or another quadrature combiner structure, can be used in combination with a Chireix-type phase-modulation drive to achieve a power-amplifier module that maintains high efficiency over a wide range of output power levels. A conventional Chireix architecture may be configured like the structure illustrated in FIG. 40. As illustrated, the power amplifiers (i.e., the transistors) are connected to the load in differential configuration. Thus, for maximum output power Ø=90, and for reduced output power, the value of Ø is reduced. Being differential, this architecture does not have a load insensitive characteristic.

Figure 41:
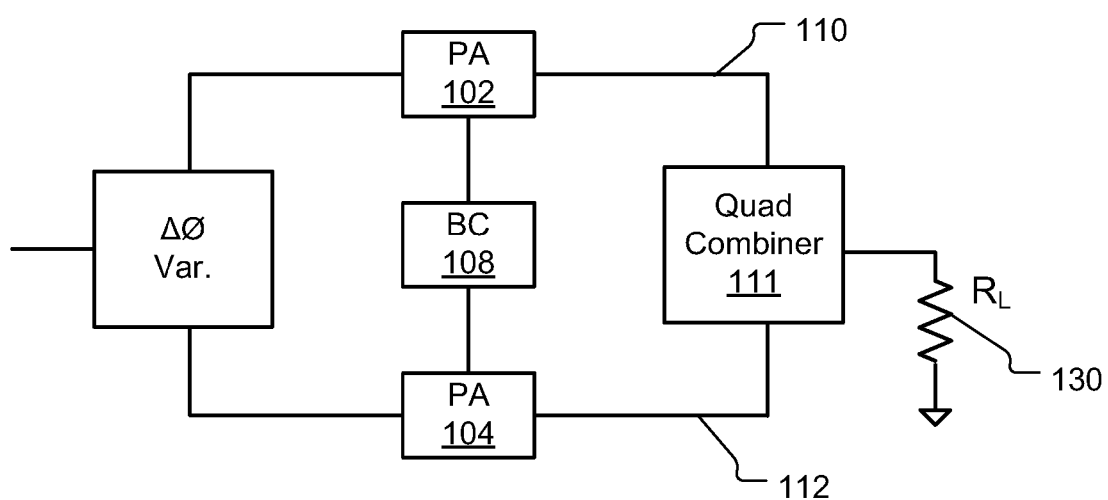
FIG. 41 is a circuit architecture using a quadrature combiner in place of a conventional Chireix circuit in accordance with various embodiments.

In contrast, a circuit architecture 4100 using a quadrature combiner 111 in place of the conventional differential combining of the traditional Chireix circuit, is illustrated in FIG. 41. This new architecture overcomes some of the principal disadvantages of conventional Chireix-type power amplifier architecture and simultaneously achieves a high degree of insensitivity to load variation.

Some drawbacks of the conventional Chireix-type power amplifier architectures may include the requirement for a large de-phasing angle for significant reductions in output power (e.g., 90° for −3 dB, 120° for −6 dB). In addition, reactive loads may cause distortion for typical RF power amplifiers, which may be deleterious to performance. Furthermore, a Chireix-type power amplifier requires a virtual, rather than a hard, center ground on the input, which can be difficult to achieve with classic differential combiners. Differential Chireix-type power amplifier architectures may also experience the same variations in gain and current draw as a conventional single-chain amplifier with varying load.

For a quadrature Chireix having high efficiency at maximum output power, and maximum load insensitivity, the lattice may be designed to present the real impedances required to both of the amplifiers 102, 104 and to combine the outputs with a differential phase shift of 90°. An example architecture is illustrated in FIG. 41.

For backed-off power, the quadrature combiner may be modified from its maximum power state to present a higher impedance to both power amplifiers 102, 104. In various embodiments, this may be most easily achieved if the relative phase shift through the two paths 110, 112 is allowed to depart from its ideal value of 90°. This phase error can be compensated for by applying an equal, but opposite, phase shift in the power amplifier drives. The power amplifiers 102, 104 may then continue to drive pure resistive loads at a reduced power level, though load insensitivity may be reduced somewhat. For reduced output power, the design approach may be:

(1) Determine the (increased) real impedance to be presented to the amplifiers 102, 104.
(2) Determine a new value for the input shunt reactances on both paths 110, 112 that will achieve this impedance and maintain the desired output impedance, keeping the series element unchanged.
(3) The value of the series elements can only be held constant by allowing the phase shift through each path 110, 112 to depart from its ideal value of 45°.
(4) Determine what this new differential phase angle will be, and adjust the phase splitter that drives the amplifiers 102, 104 accordingly.
(5) The impedances presented to both amplifiers 102, 104 will then remain pure real.

Figure 42:
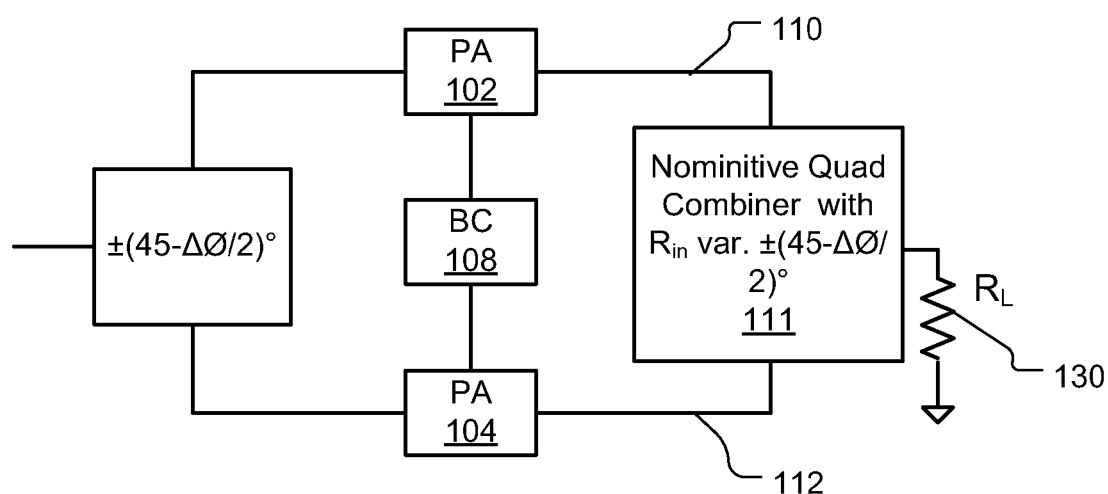
FIG. 42 is a circuit architecture using a quadrature combiner in place of a conventional Chireix circuit in accordance with various embodiments.

The output power of the lattice may be reduced, as illustrated by the circuit 4200 of FIG. 42, for example, by setting a ΔØ relative to a ±45° phase split.

Figure 43:
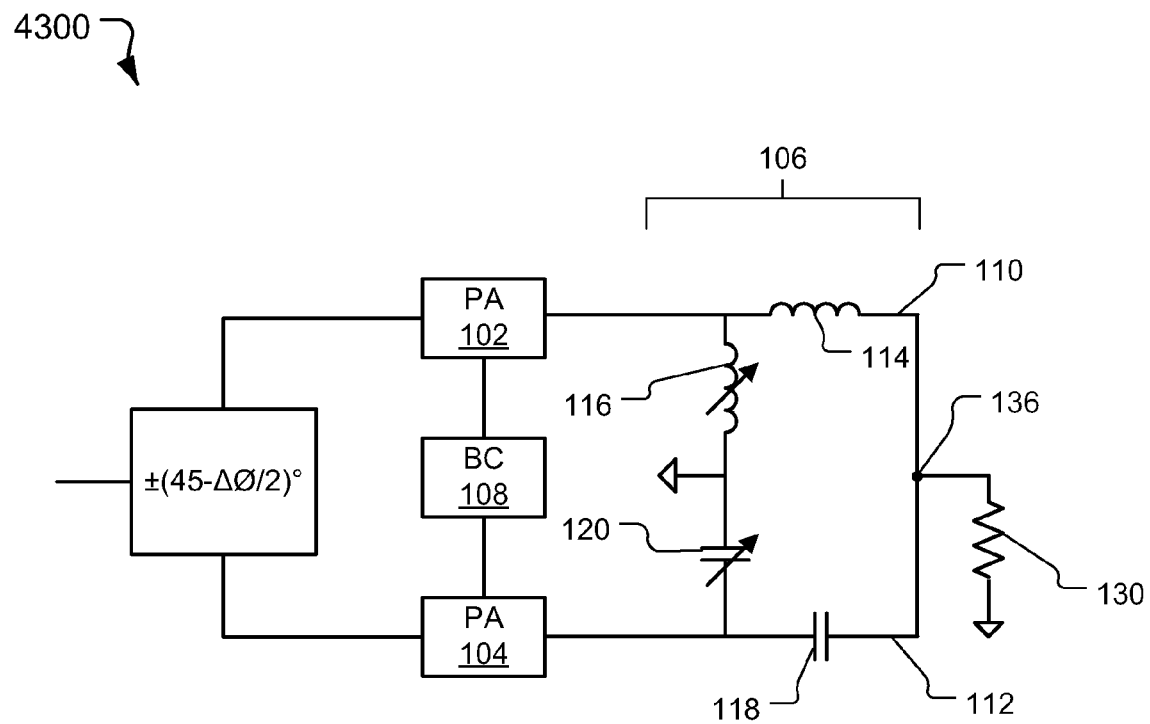
FIG. 43 is a circuit architecture using a quadrature combiner in place of a conventional Chireix circuit in accordance with various embodiments.

In various embodiments, the quadrature combiner may be implemented using the quadrature lattice matching network 106, as illustrated by the circuit 4300 of FIG. 43, with variable lattice shunt elements 116, 120. If the RF signal drive to the power amplifiers 102, 104 is modified to coincide with the new phase differential in the quadrature lattice matching network 106, the signal output will combine constructively at the output terminal 136. Thus, reduced output power may be achieved at high efficiency, while maintaining pure real impedance loadings on the amplifiers, and a constant impedance at the output terminal 136. The load insensitivity may reduce with decreasing output power, but this may be of minor concern as it may become increasingly less important at reduced power levels.

The variable lattice shunt elements 116, 120 may be varied in a number of ways including, for example, using varactors or switched elements using MEMS or solid-state switches. This approach may even be implemented in an analog manner to realize direct amplitude modulation of high peak-to-average waveforms and thereby achieve high-efficiency amplification.

Figure 44:
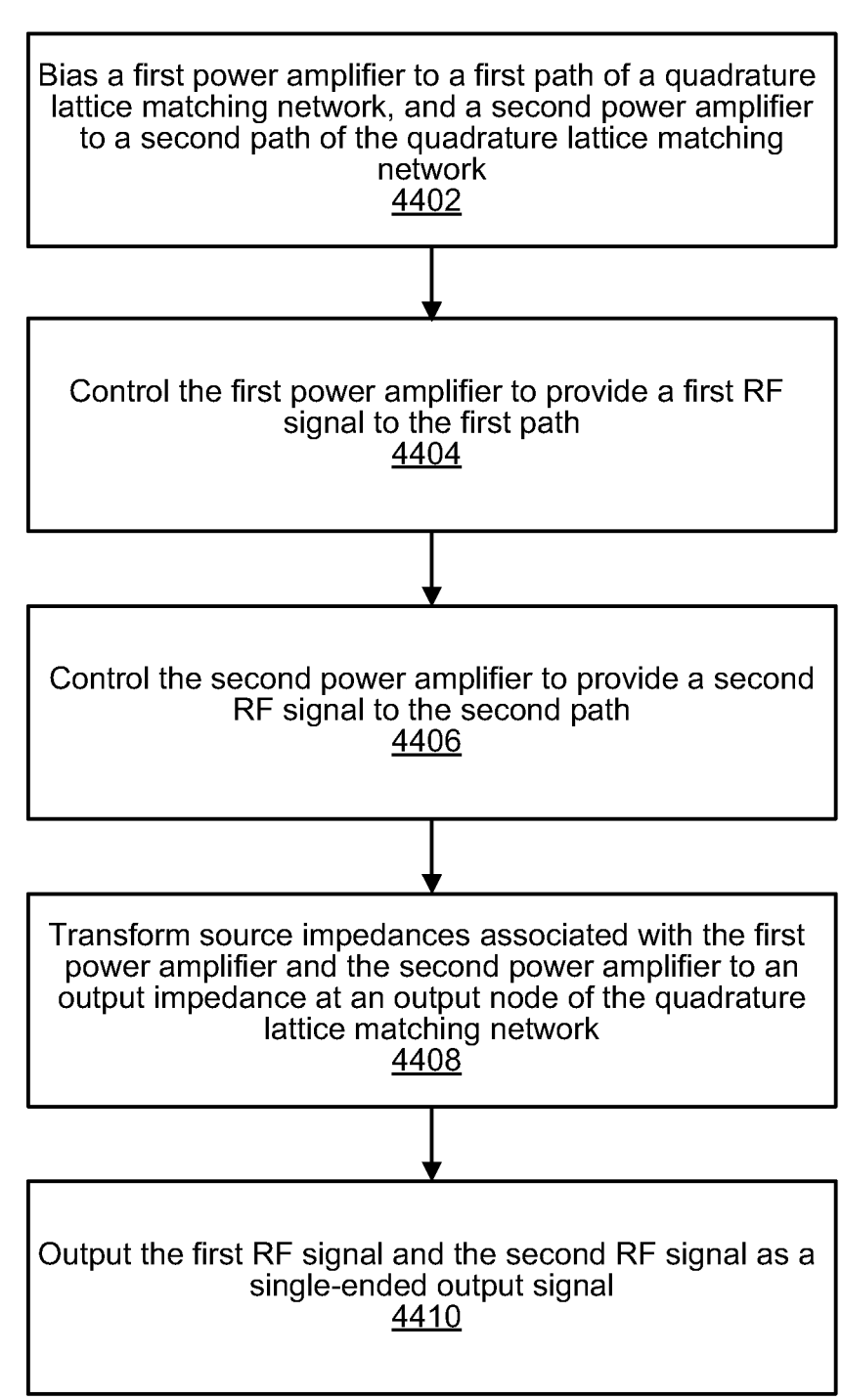
FIG. 44 is a flow diagram of some of the operations associated with a method for operating an apparatus including a quadrature lattice matching network in accordance with various embodiments.
Figure 45:
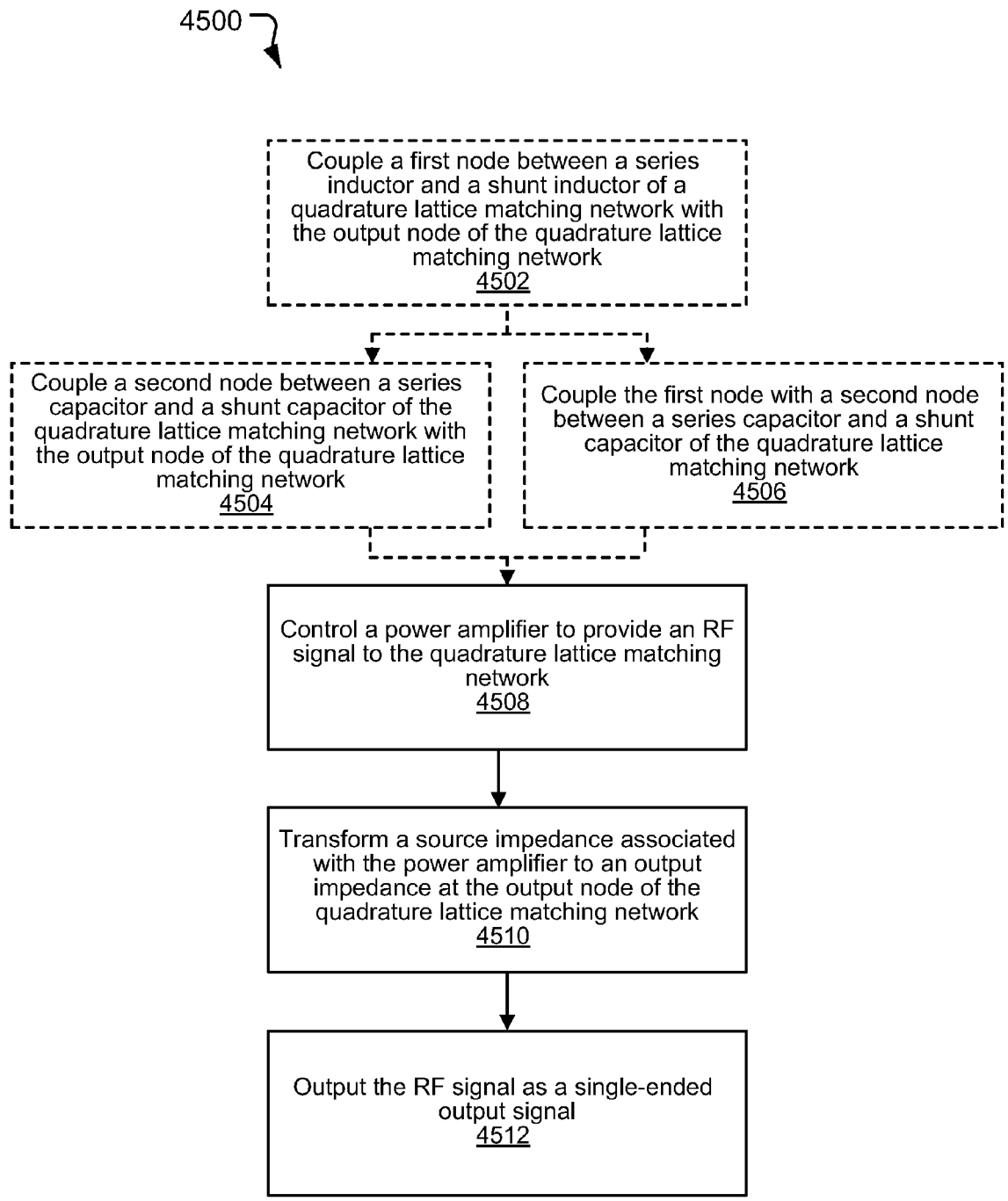
FIG. 45 is a flow diagram of some of the operations associated with another method for operating an apparatus including a quadrature lattice matching network in accordance with various embodiments.

FIGS. 44-46 illustrate flow diagrams of some of the operations associated with example methods 4400, 4500, and 4500, respectively, of using an apparatus including a quadrature lattice matching network in accordance with various embodiments described herein. The quadrature lattice matching network discussed in reference to these figures may be similar to one or more of the quadrature lattice matching networks 106, 706, 1006, 1306, 1906, 2206, 2506, 2806, 3106, 3506. It should be noted that although the methods 4400, 4500, and 4600 are each illustrated as a series of sequential steps, the methods are not necessarily order dependent. Moreover, methods within the scope of this disclosure may include more or fewer steps than those illustrated in FIGS. 44-46.

Turning now to FIG. 44, the method 4400 may include one or more functions, operations, or actions as is illustrated by block 4402, block 4404, block 4406, block 4408, and/or block 4410. Processing for the method 4400 may start with block 4402 by coupling a first power amplifier with a first path of a quadrature lattice matching network, and a second power amplifier with a second path of the quadrature lattice matching network From block 4402, the method 4400 may proceed to block 4404 by controlling the first power amplifier to provide a first RF signal to the first path of the quadrature lattice matching network, and to block 4406 by controlling the second power amplifier to provide a second RF signal to the second path of the quadrature lattice matching network.

From block 4406, the method 4400 may proceed to block 4408 by transforming source impedances associated with the first power amplifier and the second power amplifier to an output impedance at an output node of the quadrature lattice matching network. After transformation, the method 4400 may proceed to block 4410 by outputting the first and the second RF signals from the quadrature lattice matching network as a single-ended output signal.

Turning now to FIG. 45, the method 4500 may include one or more functions, operations, or actions as is illustrated by block 4502, block 4504, block 4506, block 4508, block 4510, and/or block 4512. Processing for the method 4500 may optionally start with block 4502 by directly coupling a first node, between a series inductor and a shunt inductor of a first path of a quadrature lattice matching network, with the output node of the quadrature lattice matching network. The direct coupling of the first node with the output node may cause the first path to bypass the series inductor.

From block 4502, the method 4500 may optionally proceed to block 4504 by directly coupling a second node, between a series capacitor and a shunt capacitor of a second path of the quadrature lattice matching network, with the output node of the quadrature lattice matching network. The direct coupling of the second node with the output node may cause the second path to bypass the series capacitor. In various embodiments, rather than proceeding to block 4504, the method 4500 may instead optionally proceed to block 4506 by directly coupling the first node with the second node of the second path of the quadrature lattice matching network.

From block 4504 or 4506, the method 4500 may proceed to block 4508 by controlling a power amplifier to provide an RF signal to the quadrature lattice matching network.

From block 4508, the method 4500 may proceed to block 4510 by transforming a source impedance associated with the power amplifier to an output impedance at the output node of the quadrature lattice matching network. After transformation, the method 4500 may proceed to block 4512 by outputting the RF signal as a single-ended output signal.

Turning now to FIG. 46, the method 4600 may include one or more functions, operations, or actions as is illustrated by block 4602, block 4604, block 4606, and/or block 4608. Processing for the method 4400 may start with block 4602 by de-coupling a first power amplifier from a first path of a quadrature lattice matching network, and a second power amplifier from a second path of the quadrature lattice matching network.

From block 4602, the method 4600 may proceed to block 4604 by coupling a low-power amplifier with an output node of the quadrature lattice matching network and/or with an output matching circuit that is coupled with the quadrature lattice matching network. As discussed above, the coupling of the low-power amplifier may be done through selective switching and/or biasing.

From block 4604, the method 4600 may proceed to block 4606 by controlling the low-power amplifier to provide an RF signal to the output node of the quadrature lattice matching network.

From block 4606, the method 4600 may proceed to block 4608 by outputting the RF signal as a single-ended output signal.

Figure 47:
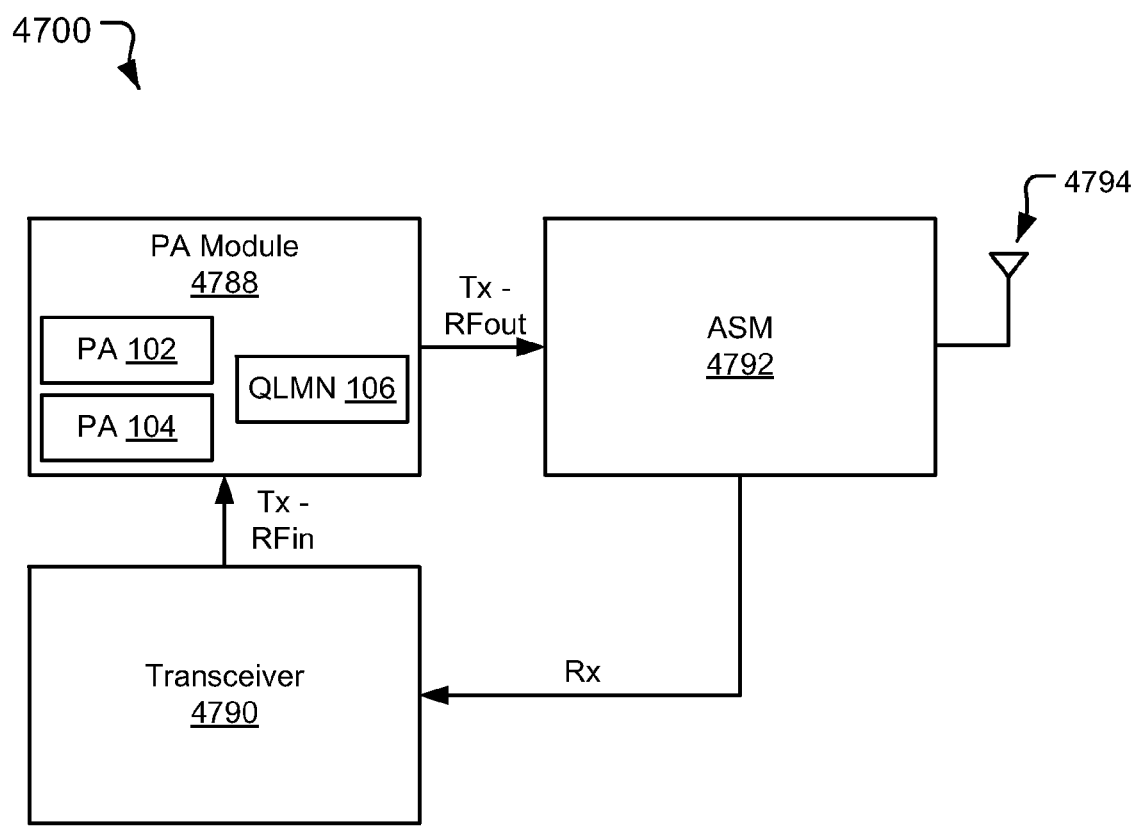
FIG. 47 is a block diagram of a system incorporating a quadrature lattice matching network in accordance with various embodiments.

Embodiments of quadrature lattice matching networks described herein, and apparatuses including such quadrature lattice matching networks, may be incorporated into various other apparatuses and systems. A block diagram of an example system 4700 is illustrated in FIG. 47. As illustrated, the system 4700 includes an RF power amplifier module 4788. The system 4700 may include a transceiver 4790 coupled with the RF power amplifier module 4788 as illustrated.

The power amplifier module 4788 may include one or more quadrature lattice matching networks as described herein. For example, the power amplifier module 4588 may include one or more of the quadrature lattice matching networks 106, 706, 1006, 1306, 1906, 2206, 2506, 2806, 3106, 3506 described herein including a first path coupled with a first power amplifier 102 and having a series inductor and a shunt inductor, and a second path coupled with a second power amplifier 104 and having a series capacitor and a shunt capacitor.

The RF power amplifier module 4788 may receive an RF input signal, RFin, from the transceiver 4790. The RF power amplifier module 4788 may amplify the RF input signal, RFin, to provide the RF output signal, RFout. The RF input signal, RFin, and the RF output signal, RFout, may both be part of a transmit chain, respectively noted by Tx–RFin and Tx–RFout in FIG. 47.

The amplified RF output signal, RFout, may be provided to an antenna switch module (ASM) 4792, which effectuates an over-the-air (OTA) transmission of the RF output signal, RFout, via an antenna structure 4594. The ASM 4792 may also receive RF signals via the antenna structure 4794 and couple the received RF signals, Rx, to the transceiver 4790 along a receive chain.

In various embodiments, the antenna structure 4794 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 4700 may be any system including power amplification. In various embodiments, the system 4700 may be particularly useful for power amplification at high radio frequency power and frequency. For example, the system 4700 may be suitable for any one or more of terrestrial and satellite communications, radar systems, and possibly in various industrial and medical applications. More specifically, in various embodiments, the system 4700 may be a selected one of a radar device, a satellite communication device, a mobile handset, a cellular telephone base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. An apparatus comprising:
   a first power amplifier;
   a second power amplifier;
   a quadrature lattice matching network including a first path coupled with the first power amplifier and having a series inductor and a shunt inductor, and a second path coupled with the second power amplifier and having a series capacitor and a shunt capacitor;
   an output matching circuit including an output inductor coupled with an output capacitor and a load, wherein the output capacitor and the load are coupled in parallel, and wherein the output matching circuit is coupled with an output node of the quadrature lattice matching network; and
   a switch selectively coupling a first node, which is between the series inductor and the shunt inductor, with a second node, which is between the output inductor and the output capacitor.

2. The apparatus of claim 1, wherein the series inductor comprises a first inductor, wherein the shunt inductor comprises a second inductor, wherein the series capacitor comprises a first capacitor, wherein the shunt capacitor comprises a second capacitor, and wherein the apparatus further comprises a third inductor coupled with an output node of the quadrature lattice matching network, a third capacitor coupled with the third inductor, and a third power amplifier coupled with a node between the third inductor and the third capacitor.

3. The apparatus of claim 1, wherein the first power amplifier is configured to be selectively biased.

4. The apparatus of claim 1, wherein the second power amplifier is configured to be selectively biased.

5. The apparatus of claim 1, wherein the series capacitor comprises a first capacitor, wherein the shunt capacitor comprises a second capacitor, and wherein the apparatus further comprises a third capacitor selectively coupled to an output node of the quadrature lattice matching network.

6. The apparatus of claim 1, wherein the series inductor is partially shorted.

7. The apparatus of claim 1, wherein the series inductor comprises a first inductor, wherein the shunt inductor comprises a second inductor, and wherein the apparatus further comprises a third inductor selectively coupled in parallel with the first inductor.

8. The apparatus of claim 1, further comprising a third power amplifier coupled with an output node of the quadrature lattice matching network.

9. The apparatus of claim 8, wherein the third power amplifier is configured to be selectively biased.

10. An apparatus comprising:
    a first power amplifier;
    a second power amplifier;
    a quadrature lattice matching network including a first path coupled with the first power amplifier and having a series inductor and a shunt inductor, and a second path coupled with the second power amplifier and having a series capacitor and a shunt capacitor;
    an output matching circuit including an output inductor coupled with an output capacitor and a load, wherein the output capacitor and the load are coupled in parallel, and wherein the output matching circuit is coupled with an output node of the quadrature lattice matching network; and
    a first switch selectively coupling a first node, which is between the series inductor and the shunt inductor, with an output node of the quadrature lattice matching network.

11. The apparatus of claim 10, further comprising a second switch selectively coupling a second node, which is between the series capacitor and the shunt capacitor, with the output node of the quadrature lattice matching network.

12. The apparatus of claim 10, further comprising a second switch selectively coupling the first node with a second node, which is between the series capacitor and the shunt capacitor.

13. An apparatus comprising:
    a first power amplifier;
    a second power amplifier;
    a quadrature lattice matching network including a first path coupled with the first power amplifier and having a series inductor and a shunt inductor, and a second path coupled with the second power amplifier and having a series capacitor and a shunt capacitor;
    an output matching circuit including an output inductor coupled with an output capacitor and a load, wherein the output capacitor and the load are coupled in parallel, and wherein the output matching circuit is coupled with an output node of the quadrature lattice matching network; and
    an output inductor coupled with an output node of the quadrature lattice matching network, an output capacitor coupled with the output inductor, and a third power amplifier coupled with a node between the output inductor and the output capacitor.

14. The apparatus of claim 13, wherein the output inductor comprises a first output inductor, wherein the output capacitor comprises a first output capacitor, and wherein the apparatus further comprises a second output inductor coupled with the node between the first output inductor and the first output capacitor inductor, and a second output capacitor coupled with the second output inductor.

15. An apparatus comprising:
a quadrature lattice matching network including a first path having a series inductor and a shunt inductor, a second path having a series capacitor and a shunt capacitor, and at least one switch operable to form a conductive path in parallel with at least one of the series inductor or the series capacitor; and
a power amplifier coupled with the first path of the quadrature lattice matching network;
wherein the switch is a first switch selectively coupling a first node, which is between the series inductor and the shunt inductor, with an output node of the quadrature lattice matching network.

16. The apparatus of claim 15, further comprising an output matching circuit including an output inductor coupled with an output capacitor and a load, wherein the output capacitor and the load are coupled in parallel, and wherein the output matching circuit is coupled to an output node of the quadrature lattice matching network.

17. The apparatus of claim 16, wherein the switch selectively couples a first node, which is between the series inductor and the shunt inductor, with a second node, which is between the output inductor and the output capacitor and the load.

18. The apparatus of 15, further comprising a second switch selectively coupling a second node, which is between the series capacitor and the shunt capacitor, with the output node of the quadrature lattice matching network.

19. The apparatus of claim 15, further comprising a second switch selectively coupling the first node with a second node, which is between the series capacitor and the shunt capacitor.

20. The apparatus of claim 15, wherein the series capacitor comprises a first capacitor, wherein the shunt capacitor comprises a second capacitor, and wherein the apparatus further comprises a third capacitor selectively coupled to an output node of the quadrature lattice matching network.

21. The apparatus of claim 15, wherein the series inductor is partially shorted.

22. The apparatus of claim 15, wherein the series inductor comprises a first inductor, wherein the shunt inductor comprises a second inductor, and wherein the apparatus further comprises a third inductor selectively coupled in parallel with the first inductor.

23. An apparatus comprising:
a quadrature lattice matching network including a first path having a series inductor and a shunt inductor, and a second path having a series capacitor and a shunt capacitor;
a low-power amplifier coupled with the quadrature lattice matching network; and
an output inductor coupled with an output node of the quadrature lattice matching network, and an output capacitor coupled in series with the output inductor, and wherein the low-power amplifier selectively coupled with a node between the output inductor and the output capacitor.

24. The apparatus of claim 23, wherein the output inductor is coupled with the output capacitor and a load to form an output matching circuit, and wherein the output capacitor and the load are coupled in parallel, and wherein the output matching circuit is coupled to the output node of the quadrature lattice matching network.

25. The apparatus of claim 24, wherein the series inductor comprises a first inductor, wherein the shunt inductor comprises a second inductor, wherein the series capacitor comprises a first capacitor, wherein the shunt capacitor comprises a second capacitor, and wherein the apparatus further comprises a third inductor coupled with an output node of the quadrature lattice matching network, and a third capacitor coupled in series with the third inductor.

26. The apparatus of claim 25, wherein the low-power amplifier is coupled with a node between the third inductor and the third capacitor.

27. The apparatus of claim 23, wherein the low-power amplifier is coupled with the output of the quadrature lattice matching network, with a node between the series inductor and the shunt inductor, or with a node between the series capacitor and the series capacitor.

28. An apparatus comprising:
a first power amplifier;
a second power amplifier;
a quadrature combiner including a first path coupled with the first power amplifier, and a second path coupled with the second power amplifier; and
a variable phase-modulation drive configured to drive the first power amplifier and the second power amplifier with a Ø of less than or greater than 180°;
wherein the variable phase-modulation drive is configured to apply a change in Ø by equally shifting the drive to the first power amplifier and to the second power amplifier from a Ø±45° phase shift split.

29. The apparatus of claim 28, wherein the quadrature combiner comprises a quadrature lattice matching network, wherein the first path is coupled with the first power amplifier and having a series inductor and a shunt inductor, and the second path is coupled with the second power amplifier and having a series capacitor and a shunt capacitor.

30. The apparatus of claim 29, wherein the shunt inductor and the shunt capacitor are variable elements.

31. A method comprising:
controlling at least one power amplifier to provide a radio frequency (RF) signal to a quadrature lattice matching network including a first path located between a first power amplifier and a common output node and having a series inductor and a shunt inductor and a second path located between a second power amplifier and the common output node and having a series capacitor and a shunt capacitor;
selectively coupling a first node between the series inductor and the shunt inductor with the output node of the quadrature lattice matching network; and
transforming, by the quadrature lattice matching network, a source impedance associated with the at least one power amplifier to an output impedance at an output node of the quadrature lattice matching network.

32. The method of claim 31, further comprising outputting, by the quadrature lattice matching network, the RF signal as a single-ended output signal.

33. The method of claim 31, further comprising selectively coupling a second node between the series capacitor and the shunt capacitor with the output node of the quadrature lattice matching network.

34. The method of claim 31, further comprising selectively coupling the first node with a second node between the series capacitor and the shunt capacitor.

35. The method of claim 31, wherein the at least one power amplifier is the first power amplifier, and wherein the method further comprises biasing the first power amplifier to the first path of the quadrature lattice matching network, and biasing a third power amplifier to at least one of the first or the second path of the quadrature lattice matching network.

36. The method of claim 31, further comprising alternatively controlling the quadrature lattice matching network in a high-power mode and a low-power mode.

37. The method of claim 31, further comprising partially shorting the series inductor.

38. A method comprising:
controlling a plurality of high-power amplifiers to provide a high-power radio frequency (RF) signal;
transforming, with a quadrature lattice matching network including a first path having a series inductor and a shunt inductor, and a second path having a series capacitor and a shunt capacitor, a source impedance associated with the plurality of high-power amplifiers to an output impedance at an output node of the quadrature lattice matching network; and
controlling a low-power amplifier directly coupled to the output node to provide a low-power RF signal to the output node of the quadrature lattice matching network.

39. The method of claim 38, further comprising:
unbiasing the plurality of high-power amplifiers during said controlling of the low-power amplifier to provide the low-power RF signal.

40. The method of claim 38, further comprising:
unbiasing the low-power amplifier during said controlling of the plurality of high-power amplifiers to provide the high-power RF signal.

41. The method of claim 38, further comprising de-coupling the plurality of high-power amplifiers from the first and second paths of the quadrature lattice matching network during said controlling the low-power amplifier to provide the low-power RF signal.

42. The method of claim 38, further comprising providing the low-power RF signal to the output node of the quadrature lattice matching network.

43. The method of claim 38, further comprising providing the low-power RF signal to a node of an output matching circuit.

44. The method of claim 38, wherein the low-power RF signal is provided to the output node of the quadrature lattice matching network, to a node between the series inductor and the shunt inductor, or to a node between the series capacitor and the shunt capacitor.

* * * * *